(12) United States Patent
Xu et al.

(10) Patent No.: US 11,393,877 B2
(45) Date of Patent: Jul. 19, 2022

(54) DISPLAY SUBSTRATE HAVING FIRST PIXEL UNIT AND SECOND PIXEL UNIT WITH UNEQUAL EFFECTIVE LIGHT-EMITTING AREAS AND EQUAL LIGHT-REFLECTING AREAS, FABRICATION METHOD THEREOF, AND DISPLAY DEVICE

(71) Applicant: BOE TECHNOLOGY GROUP CO., LTD., Beijing (CN)

(72) Inventors: Zhiqiang Xu, Beijing (CN); Tieshi Wang, Beijing (CN); Wei Qin, Beijing (CN); Wanpeng Teng, Beijing (CN); Chuanxiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 231 days.

(21) Appl. No.: 16/652,753

(22) PCT Filed: Apr. 1, 2019

(86) PCT No.: PCT/CN2019/080832
§ 371 (c)(1),
(2) Date: Apr. 1, 2020

(87) PCT Pub. No.: WO2020/199083
PCT Pub. Date: Oct. 8, 2020

(65) Prior Publication Data
US 2021/0233966 A1 Jul. 29, 2021

(51) Int. Cl.
*H01L 27/32* (2006.01)
*H01L 51/52* (2006.01)
*H01L 51/56* (2006.01)

(52) U.S. Cl.
CPC ...... *H01L 27/3216* (2013.01); *H01L 27/3246* (2013.01); *H01L 51/5284* (2013.01);
(Continued)

(58) Field of Classification Search
CPC combination set(s) only.
See application file for complete search history.

(56) References Cited

U.S. PATENT DOCUMENTS

| 2012/0299033 A1 | 11/2012 | Goda |
| 2014/0061611 A1 | 3/2014 | Sung |

(Continued)

FOREIGN PATENT DOCUMENTS

| CN | 102726122 | 10/2012 |
| CN | 103681750 | 3/2014 |

(Continued)

*Primary Examiner* — Nduka E Ojeh
(74) *Attorney, Agent, or Firm* — Leason Ellis LLP

(57) ABSTRACT

A display substrate and a fabrication method thereof, and a display device. The display substrate includes a first pixel unit and a second pixel unit. The first pixel unit includes a first electrode and a first light-emitting layer that are stacked; the second pixel unit includes a second electrode and a second light-emitting layer that are stacked; an effective light-emitting area of the first light-emitting layer is unequal to an effective light-emitting area of the second light-emitting layer; and in a direction directly facing a display side of the display substrate, a light-reflecting area of the first electrode that is exposed in the first pixel unit is equal to a light-reflecting area of the second electrode that is exposed in the second pixel unit. The display substrate may suppress a color shift defect.

20 Claims, 11 Drawing Sheets

(52) U.S. Cl.
CPC ............ *H01L 51/56* (2013.01); *H01L 27/322* (2013.01); *H01L 51/5218* (2013.01); *H01L 2227/323* (2013.01); *H01L 2251/5315* (2013.01)

(56) References Cited

U.S. PATENT DOCUMENTS

| | | | |
|---|---|---|---|
| 2018/0033842 A1* | 2/2018 | Bae | H01L 51/5206 |
| 2019/0006437 A1* | 1/2019 | Lin | H01L 27/3283 |

FOREIGN PATENT DOCUMENTS

| | | |
|---|---|---|
| CN | 107665905 | 2/2018 |
| CN | 109216569 | 1/2019 |
| JP | 2009071176 | 4/2009 |

\* cited by examiner

DISPLAY SUBSTRATE HAVING FIRST PIXEL UNIT AND SECOND PIXEL UNIT WITH UNEQUAL EFFECTIVE LIGHT-EMITTING AREAS AND EQUAL LIGHT-REFLECTING AREAS, FABRICATION METHOD THEREOF, AND DISPLAY DEVICE

The present application is a U.S. National Phase Application under 35 U.S.C. § 371 of International Patent Application No. PCT/CN2019/080832, filed Apr. 1, 2019, the present disclosure of which is incorporated herein by reference in its entirety as part of the present disclosure.

TECHNICAL FIELD

Embodiments of the present disclosure relate to a display substrate and a fabrication method thereof, and a display device.

BACKGROUND

Organic Light Emitting Diode (OLED) display panels have gradually attracted the attention of people due to wide viewing angle, high contrast, fast response, and advantages such as higher luminance, lower driving voltage and the like over inorganic light emitting diode display devices. Because of the above-mentioned characteristics, the organic light emitting diode (OLED) display panels may be applied into devices with display functions, such as mobile phones, displays, laptops, digital cameras, instruments, and the like.

SUMMARY

At least an embodiment of the present disclosure provides a display substrate, comprising a first pixel unit and a second pixel unit. The first pixel unit comprises a first electrode and a first light-emitting layer that are stacked; the second pixel unit comprises a second electrode and a second light-emitting layer that are stacked; an effective light-emitting area of the first light-emitting layer is unequal to an effective light-emitting area of the second light-emitting layer; and in a direction directly facing a display side of the display substrate, a light-reflecting area of the first electrode that is exposed in the first pixel unit is equal to a light-reflecting area of the second electrode that is exposed in the second pixel unit.

For example, in at least one example of the display substrate, the first electrode and the second electrode are spaced apart and insulated from each other; and an area of the first electrode is equal to an area of the second electrode.

For example, in at least one example of the display substrate, the display substrate further comprises a base substrate and a pixel defining layer. The pixel defining layer is on a side, which is away from the base substrate, of both the first electrode and the second electrode, and the pixel defining layer is formed with a first pixel opening and a second pixel opening; the first pixel unit comprises the first pixel opening, and the second pixel unit comprises the second pixel opening; an orthogonal projection of the first pixel opening on the base substrate is within an orthogonal projection of the first electrode on the base substrate, and an orthogonal projection of the second pixel opening on the base substrate is within an orthogonal projection of the second electrode on the base substrate; an orthogonal projection of the first light-emitting layer on the base substrate is within the orthogonal projection of the first pixel opening on the base substrate, and an orthogonal projection of the second light-emitting layer on the base substrate is within the orthogonal projection of the second pixel opening on the base substrate.

For example, in at least one example of the display substrate, a size of the first pixel opening is unequal to a size of the second pixel opening; and the effective light-emitting area of the first light-emitting layer is an area, in the first pixel opening of the first light-emitting layer, and the effective light-emitting area of the second light-emitting layer is an area, in the second pixel opening of the second light-emitting layer.

For example, in at least one example of the display substrate, an overlapping area between the pixel defining layer and the first electrode is smaller than an overlapping area between the pixel defining layer and the second electrode.

For example, in at least one example of the display substrate, a size of the first pixel opening is equal to a size of the second pixel opening; and the effective light-emitting area of the first light-emitting layer is smaller than the size of the first pixel opening, and the effective light-emitting area of the second light-emitting layer is smaller than the size of the second pixel opening.

For example, in at least one example of the display substrate, the display substrate further comprises a transparent insulating layer. The transparent insulating layer is on a side, which is away from the base substrate, of both the first electrode and the second electrode, and the transparent insulating layer is formed with a first insulating layer opening and a second insulating layer opening; and the effective light-emitting area of the first light-emitting layer is an area, in the first insulating layer opening, of the first light-emitting layer, and the effective light-emitting area, in the second insulating layer opening, of the second light-emitting layer is an area of the second light-emitting layer.

For example, in at least one example of the display substrate, an overlapping area between the transparent insulating layer and the first electrode is smaller than an overlapping area between the transparent insulating layer and the second electrode.

For example, an electrode layer in which the first electrode and the second electrode are located, the transparent insulating layer and the pixel defining layer are sequentially arranged in a direction perpendicular to the base substrate.

For example, in at least one example of the display substrate, an electrode layer in which the first electrode and the second electrode are located, the pixel defining layer and the transparent insulating layer are sequentially arranged in a direction perpendicular to the base substrate.

For example, in at least one example of the display substrate, the display substrate further comprises a color filter layer. The color filter layer is provided on a side, which is away from the base substrate, of both the first light-emitting layer and the second light-emitting layer, and the color filter layer comprises a black matrix; the black matrix is formed with a first black matrix opening and a second black matrix opening; the first pixel unit comprises the first black matrix opening, and the second pixel unit comprises the second black matrix opening; an orthogonal projection of the first black matrix opening on the base substrate is within the orthogonal projection of the first electrode on the base substrate, and an orthogonal projection of the second black matrix opening is within the orthogonal projection of the second electrode on the base substrate; and the first black matrix opening exposes a light reflection region of the first electrode, and the second black matrix opening exposes a light reflection region of the second electrode.

For example, in at least one example of the display substrate, a size of the first black matrix opening is equal to a size of the second black matrix opening; a size of the first electrode is larger than or equal to the size of the first black matrix opening, and a size of the second electrode is larger than or equal to the size of the second black matrix opening; and a separation distance between the black matrix and the first electrode in the direction is equal to a separation distance between the black matrix and the second electrode in the direction.

For example, in at least one example of the display substrate, the color filter layer further comprises a first filter and a second filter; the first filter is in the first black matrix opening, and the second filter is in the second black matrix opening; the first light-emitting layer is configured to emit first monochromatic light, and the second light-emitting layer is configured to emit second monochromatic light; and a color of the first filter is same as a color of the first monochromatic light, and a color of the second filter is same as a color of the second monochromatic light.

For example, in at least one example of the display substrate, the display substrate further comprises an opposed electrode layer, an encapsulation layer and a protective layer. The opposed electrode layer is on a side, which is away from the base substrate, of the first light-emitting layer and the second light-emitting layer; the encapsulation layer is between the opposed electrode layer and the color filter layer; and the protective layer is on a side of the color filter layer that is away from the base substrate.

For example, in at least one example of the display substrate, the effective light-emitting area of the first light-emitting layer is larger than the effective light-emitting area of the second light-emitting layer.

For example, in at least one example of the display substrate, the display substrate further comprises a third pixel unit. The third pixel unit comprises a third electrode and a third light-emitting layer that are stacked; the effective light-emitting area of the second light-emitting layer is larger than an effective light-emitting area of the third light-emitting layer; and in the direction directly facing the display side of the display substrate, the light-reflecting area of the second electrode that is exposed in the second pixel unit is equal to a light-reflecting area of the third electrode that is exposed in the third pixel unit.

At least an embodiment of the present disclosure further provides a display device, and the display device comprises the display substrate provided by any one embodiment of the present disclosure.

At least an embodiment of the present disclosure further provides a fabrication method of a display substrate, comprising: forming a first pixel unit and a second pixel unit. The first pixel unit comprises a first electrode and a first light-emitting layer that are stacked; the second pixel unit comprises a second electrode and a second light-emitting layer that are stacked; an effective light-emitting area of the first light-emitting layer is unequal to an effective light-emitting area of the second light-emitting layer; and in a direction directly facing a display side of the display substrate, a light-reflecting area of the first electrode that is exposed in the first pixel unit is equal to a light-reflecting area of the second electrode that is exposed in the second pixel unit.

For example, in at least one example of the fabrication method, the first electrode and the second electrode are spaced apart and insulated from each other; an area of the first electrode is equal to an area of the second electrode.

For example, in at least one example of the fabrication method, the fabrication method further comprises: providing a base substrate before the forming the first pixel unit and the second pixel unit arranged in parallel. The forming the first pixel unit and the second pixel unit arranged in parallel comprises: forming the pixel defining layer on a side, which is away from the base substrate, of the first electrode and the second electrode; and forming a first pixel opening and a second pixel opening in the pixel defining layer. The first pixel unit comprises the first pixel opening, and the second pixel unit comprises the second pixel opening; an orthogonal projection of the first pixel opening on the base substrate is within an orthogonal projection of the first electrode on the base substrate, and an orthogonal projection of the second pixel opening on the base substrate is within an orthogonal projection of the second electrode on the base substrate; and an orthogonal projection of the first light-emitting layer on the base substrate is within the orthogonal projection of the first pixel opening on the base substrate, and an orthogonal projection of the second light-emitting layer on the base substrate is within the orthogonal projection of the second pixel opening on the base substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
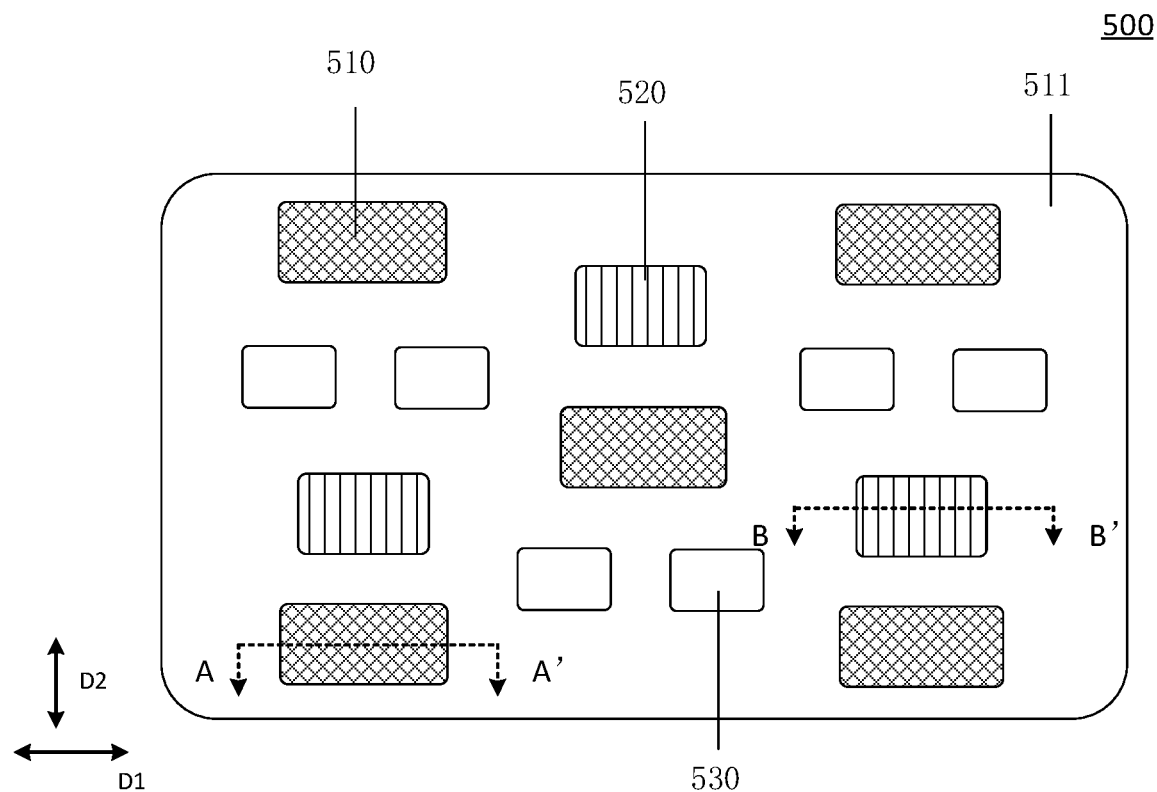
FIG. 1 is a schematic plan view of a display substrate.

FIG. 1 is a schematic plan view of a display substrate 500. As illustrated in FIG. 1, the display substrate 500 comprises a base substrate 501 as well as a first pixel unit 510, a second pixel unit 520 and a third pixel unit 530 arranged on the base substrate 501. For example, the first pixel unit 510, the second pixel unit 520 and the third pixel unit 530 are arranged in parallel on the base substrate 501 respectively along a first direction D1 and a second direction D2.

Figure 2A:
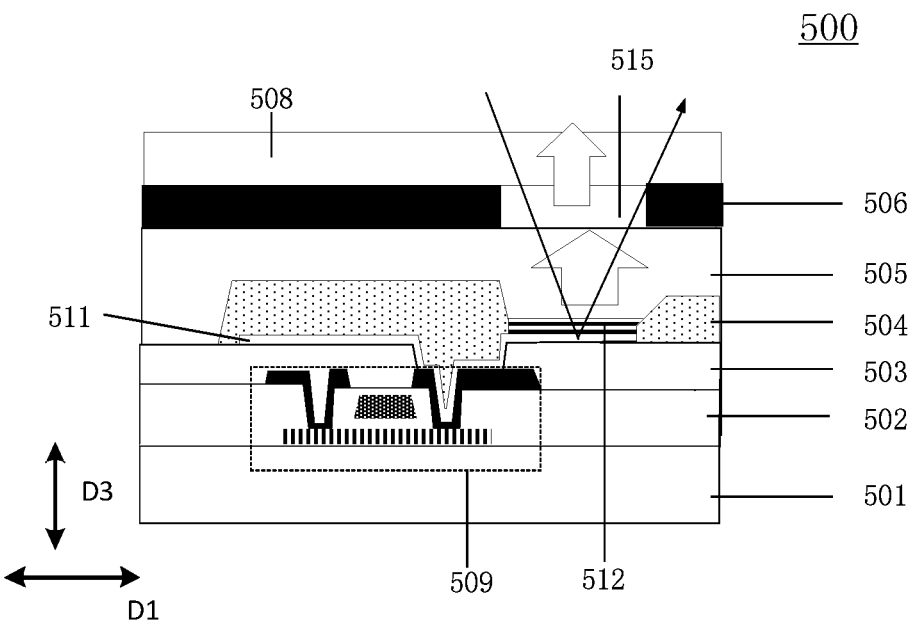
FIG. 2A is a partial cross-sectional schematic diagram of a first pixel unit shown in FIG. 1.

FIG. 2A is a partial cross-sectional schematic diagram of the first pixel unit 510 shown in FIG. 1; and the partial cross-sectional schematic diagram shown in FIG. 2A is obtained by sectioning along a line A-A' shown in FIG. 1.

As illustrated in FIG. 2A, the first pixel unit 510 includes a transistor 509, a first electrode 511 electrically connected with the transistor 509, a pixel defining layer 504, a first light-emitting layer 512, an opposed electrode (not shown in FIG. 2A), an encapsulation layer 505, a first filter 515, a black matrix 506, a protective layer 508, a first insulating layer 502 and a second insulating layer 503. The first light-emitting layer 512 emits first monochromatic light under the driving of the first electrode 511 and the opposed electrode; and a color of the first monochromatic light is the same as a color of the first filter 515 (e.g., both are blue), and therefore, the first filter 515 has a high transmittance with respect to the first monochromatic light; for example, the transmittance with respect to the first monochromatic light is greater than 95%.

Figure 2B:
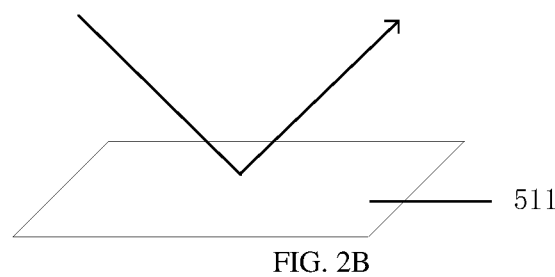
FIG. 2B is a schematic diagram of a first electrode reflecting ambient light.

For example, as illustrated in FIG. 2A and FIG. 2B, the first electrode 511 may reflect ambient light (e.g., visible light in the ambient light), and therefore, when the ambient light is incident on the first electrode 511, at least a portion of the ambient light is reflected by the first electrode 511 onto the first filter 515. The first filter 515 may filter out (e.g., absorb) light of a color different from the first monochromatic light in the ambient light, and may transmit light of a color the same as the first monochromatic light in the ambient light. Therefore, the first filter 515 may suppress the ambient light reflected by the first electrode 511 to a certain extent (i.e., reduce an intensity of the ambient light reflected by the first electrode 511), so that contrast of a display image of the display substrate 500 may be improved. In this case, the first pixel unit 510 shown in FIG. 2A does not have to be provided with a polarizer (e.g., a circular polarizer) on a side of the protective layer 508 that is away from the first light-emitting layer 512, which, thus, may prevent the polarizer from absorbing light emitted from the first light-emitting layer 512, and enhance display brightness of the first pixel unit 510 (e.g., a maximum value of an intensity of the light emitted from the first pixel unit 510).

However, in the study, an inventor of the present disclosure notices that: the display substrate 500 shown in FIG. 1 usually has a color shift defect, especially when the display substrate 500 displays a display picture with lower brightness and/or the display picture is observed from a side face of the display substrate 500. Hereinafter, exemplary description is provided in conjunction with FIG. 1, FIG. 3A and FIG. 3B.

Figure 3A:
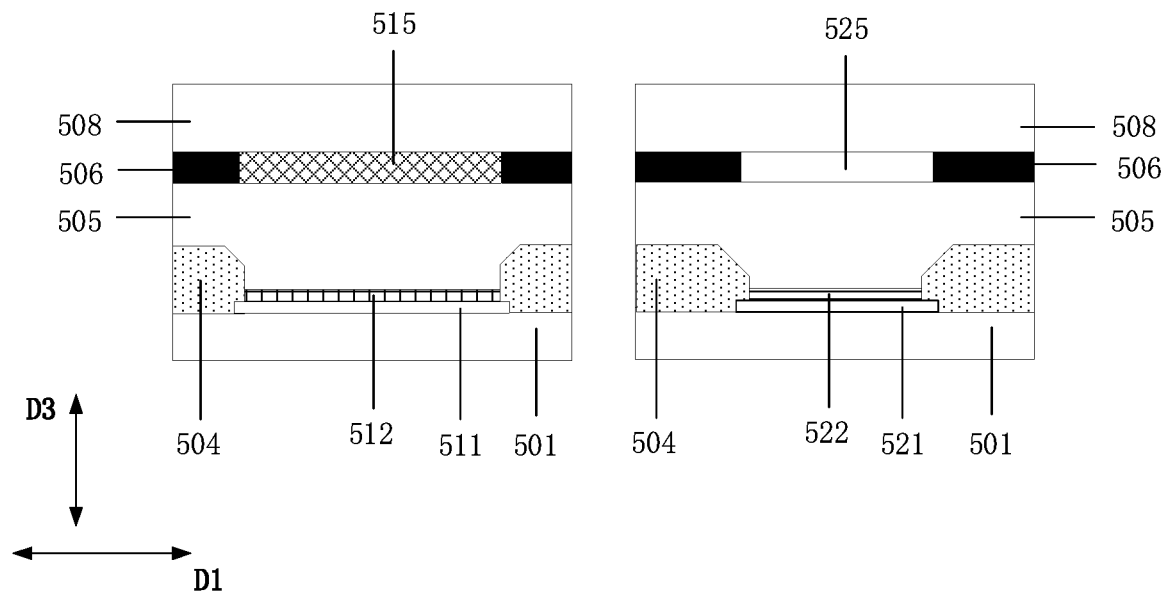
FIG. 3A is a partial cross-sectional schematic diagram of the first pixel unit and a second pixel unit shown in FIG. 1.

FIG. 3A is a partial cross-sectional schematic diagram of the first pixel unit 510 and the second pixel unit 520 shown in FIG. 1. It should be noted that, for the sake of clarity, as compared with the first pixel unit 510 shown in FIG. 2A, in the first pixel unit 510 shown in FIG. 3A, a film layer and a structure related to the transistor 509 are not shown. The partial cross-sectional schematic diagram of the second pixel unit 520 shown in FIG. 3A is obtained by sectioning along a line B-B' shown in FIG. 1.

As illustrated in FIG. 3A, the second pixel unit 520 includes a second electrode 521, a pixel defining layer 504, a second light-emitting layer 522, an opposed electrode (not shown in FIG. 3A), an encapsulation layer 505, a color filter layer (including a second filter 525 and a black matrix 506), and a protective layer 508 which are sequentially arranged on the base substrate 501 (sequentially arranged along a third direction D3). The second light-emitting layer 522 emits second monochromatic light under the driving of the second electrode 521 and the opposed electrode, and a color of the second monochromatic light is the same as of the second filter 525 (e.g., both are red), and therefore, the second filter 525 has a high transmittance with respect to the second monochromatic light (e.g., the transmittance with respect to the second monochromatic light is greater than 95%). The second electrode 521 may reflect ambient light, and therefore, when the ambient light is incident on the second electrode 521, at least a portion of the ambient light is reflected by the second electrode 521 onto the second filter 525; the second filter 525 may filter out light of a color different from the second monochromatic light in the ambient light, and may transmit light of a color the same as the second monochromatic light in the ambient light. It should be noted that, that the pixel defining layer 504 and the second light-emitting layer 522 are sequentially arranged refers to that the second light-emitting layer 522 is formed after the pixel defining layer 504 is formed, and the second light-emitting layer 522 is provided in an opening of the pixel defining layer 504.

For example, the first light-emitting layer 512 includes a first light-emitting material; the second light-emitting layer 522 includes a second light-emitting material; and luminous efficiency of the first light-emitting material is less than luminous efficiency of the second light-emitting material, that is, under the driving of a same driving signal, an intensity of light (e.g., blue light) emitted by per unit area of the first light-emitting material is less than an intensity of light (e.g., red light) emitted by per unit area of the second light-emitting material.

As illustrated in FIG. 1 and FIG. 3A, an area of the first light-emitting layer 512 is larger than an area of the second light-emitting layer 522, and an area of the first electrode 511 is larger than an area of the second electrode 521, so that a matching degree between brightness of the first pixel unit 510 and brightness of the second pixel unit 520 may be improved. For example, light emitted by the first pixel unit 510 and light emitted by the second pixel unit 520 may be mixed with light emitted by the third pixel unit 530 into white light (as driven by a same driving signal).

However, the inventor of the present disclosure notices that: because the area of the first electrode 511 is larger than the area of the second electrode 521, an intensity of the ambient light reflected by the first electrode 511 is greater than an intensity of the ambient light reflected by the second electrode 521, so an intensity of light having a color same as the first monochromatic light (hereinafter referred to as first ambient light) in the ambient light transmitted by the first filter 515 is greater than an intensity of light having a color the same as the second monochromatic light (hereinafter referred to as second ambient light) in the ambient light transmitted by the second filter 525. Light observed by a user that has a color the same as the first monochromatic light includes the first monochromatic light originating from the first light-emitting layer 512 and the first ambient light, and light observed by the user that has a color the same as the second monochromatic light includes the second monochromatic light originating from the second light-emitting layer 522 and the second ambient light. Since the intensity of the first ambient light is greater than the intensity of the second ambient light, as compared with a predetermined display picture, a color of the display picture observed by the user is shifted to the color of the first monochromatic light (e.g., bluish), which will cause the color shift defect and degrade user experience.

In addition, the inventor of the present disclosure notices that: the problem of the color shift defect of the display substrate 500 shown in FIG. 1 is worsened when the display substrate 500 displays a display picture with lower brightness and/or the display picture is observed from the side face of the display substrate 500. Specific reasons are as follows.

Firstly, when the display substrate 500 displays a display picture with lower brightness (e.g., displays a completely black picture), a ratio of a difference between the intensity of the first ambient light reflected by the first pixel unit and the intensity of the second ambient light reflected by the second pixel unit to an intensity of light observed by the user is relatively large, so the user may, for example, easily observe the difference between the intensity of the first ambient light and the intensity of the second ambient light, which worsens the problem of the color shift defect.

Figure 3B:
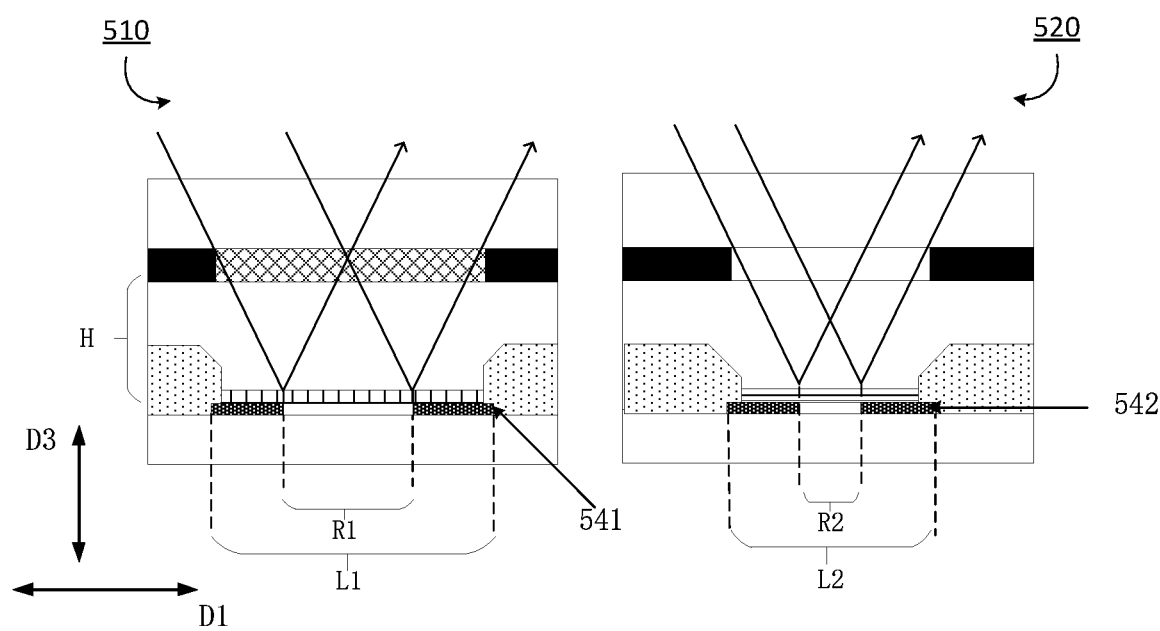
FIG. 3B is a schematic diagram of reflected light when ambient light is incident from a side face of the display substrate to the first electrode and the second electrode.

Secondly, FIG. 3B shows a schematic diagram of the ambient light when the user observes the display picture from the side face of the display substrate 500; as illustrated in FIG. 3B, when the user observes the display picture from the side face of the display substrate 500, a size R1 of a light reflection region of the first electrode 511 is smaller than a size L1 of the first electrode 511, and a size R2 of a light reflection region of the second electrode 521 is smaller than a size L2 of the second electrode 521; in a case where a separation distance between the black matrix 506 and the first electrode 511 is equal to a separation distance between the black matrix 506 and the second electrode 521 (e.g., both are equal to H), because an angle of the first ambient light incident on a first reflective electrode is approximately equal to an angle of the second ambient light incident on a second reflective electrode, and an overall size of a non-light reflection region 541 of the first electrode 511 is equal to an overall size of a non-light reflection region 542 of the second electrode 521, so that a difference R1−R2 between the size R1 of the light reflection region of the first electrode 511 and the size R2 of the light reflection region of the second electrode 521 is equal to a difference L1−L2 between the size L1 of the first electrode 511 and the size L2 of the second electrode 521. As compared with a case where the user observes the display picture from a front face of the display substrate 500, in a case the user observes the display picture from the side face of the display substrate 500, the difference between the intensity of the first ambient light reflected by the first pixel unit and the intensity of the second ambient light reflected by the second pixel unit remains unchanged, but the ratio of the difference between the intensity of the first ambient light reflected by the first pixel unit and the intensity of the second ambient light reflected by the second pixel unit to the intensity of the light observed by the user is increased, so the color shift phenomenon observed by the user is deteriorated.

At least one embodiment of the present disclosure provides a display substrate and a fabrication method thereof, and a display device. The display substrate comprises a first pixel unit and a second pixel unit arranged in parallel. The first pixel unit includes a first electrode and a first light-emitting layer that are stacked; the second pixel unit includes a second electrode and a second light-emitting layer that are stacked; an effective light-emitting area of the first light-emitting layer is unequal to an effective light-emitting area of the second light-emitting layer; and in a direction directly facing a display side of the display substrate, a light-reflecting area of the first electrode that is exposed in the first pixel unit is equal to a light-reflecting area of the second electrode that is exposed in the second pixel unit.

In some embodiments, by enabling an effective light-emitting area of a first light-emitting layer to be unequal to an effective light-emitting area of a second light-emitting layer, and by enabling a light-reflecting area of a first electrode that is exposed in a first pixel unit to be equal to a light-reflecting area of a second electrode that is exposed in a second pixel unit, in a case where, for example, maximum light emission brightness of the first pixel unit matches maximum light emission brightness of the second pixel unit (as driven by a same driving signal), a matching degree between an intensity of light reflected by the first pixel unit and an intensity of light reflected by the second pixel unit may be improved, which, thus, may suppress and alleviate a color shift defect of a display substrate (e.g., Moiré caused by color shift), and improve user experience.

Non-limitative descriptions are given to the display substrate provided by the embodiments of the present disclosure in the following with reference to a plurality of examples. As described in the following, in case of no conflict, different features in these specific examples can be combined so as to obtain new examples, and the new examples are also fall within the scope of present disclosure.

Figure 4A:
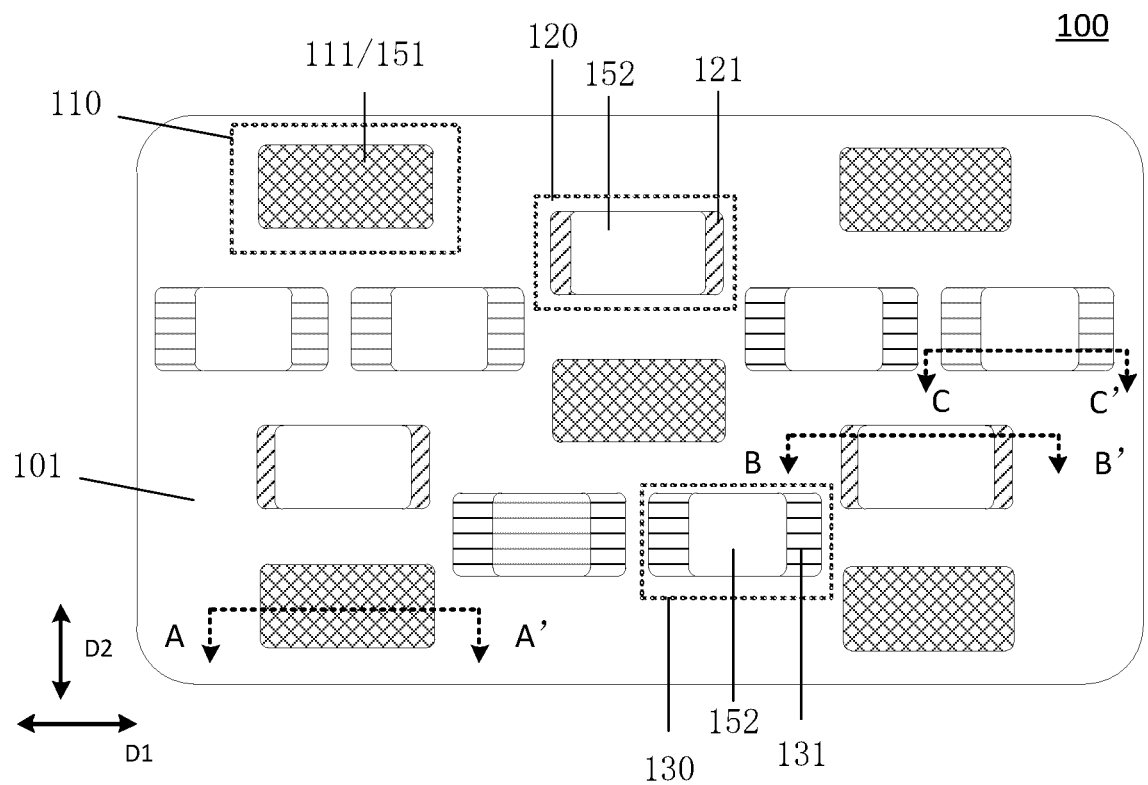
FIG. 4A is a schematic plan view of a display substrate provided by at least one embodiment of the present disclosure.

FIG. 4A shows a schematic plan view of a display substrate 100 provided by at least one embodiment of the present disclosure. As illustrated in FIG. 4A, the display substrate 100 comprises a base substrate 101 as well as a first pixel unit 110, a second pixel unit 120 and a third pixel unit 130 arranged on the base substrate 101. For example, the first pixel unit 110, the second pixel unit 120 and the third pixel unit 130 are arranged in parallel on the base substrate 101 respectively along a first direction D1 and a second direction D2.

It should be noted that, that the first pixel unit, the second pixel unit and the third pixel unit are arranged in parallel respectively along the first direction D1 and the second direction D2 on the base substrate refers to that the first pixel unit, the second pixel unit and the third pixel unit are located in a same layer, but it is not limited to that the first pixel unit, the second pixel unit and the third pixel unit are located in a same row or located in a same column. For example, the first pixel unit, the second pixel unit and the third pixel unit may be arranged in a delta shape (referring to FIG. 4A) or other applicable shape.

As illustrated in FIG. 4A, an area of an effective light-emitting region 151 of a first light-emitting layer is larger than an area of an effective light-emitting region 152 of a second light-emitting layer, and the area of the effective light-emitting region 152 of the second light-emitting layer is larger than an area of an effective light-emitting region 153 of a third light-emitting layer; a light-reflecting area of a first electrode that is exposed in the first pixel unit, a light-reflecting area of a second electrode that is exposed in the second pixel unit and a light-reflecting area of a third electrode that is exposed in the third pixel unit are equal to each other. Hereinafter, it is specifically described in conjunction with FIG. 4B and FIG. 4C.

Figure 4B:
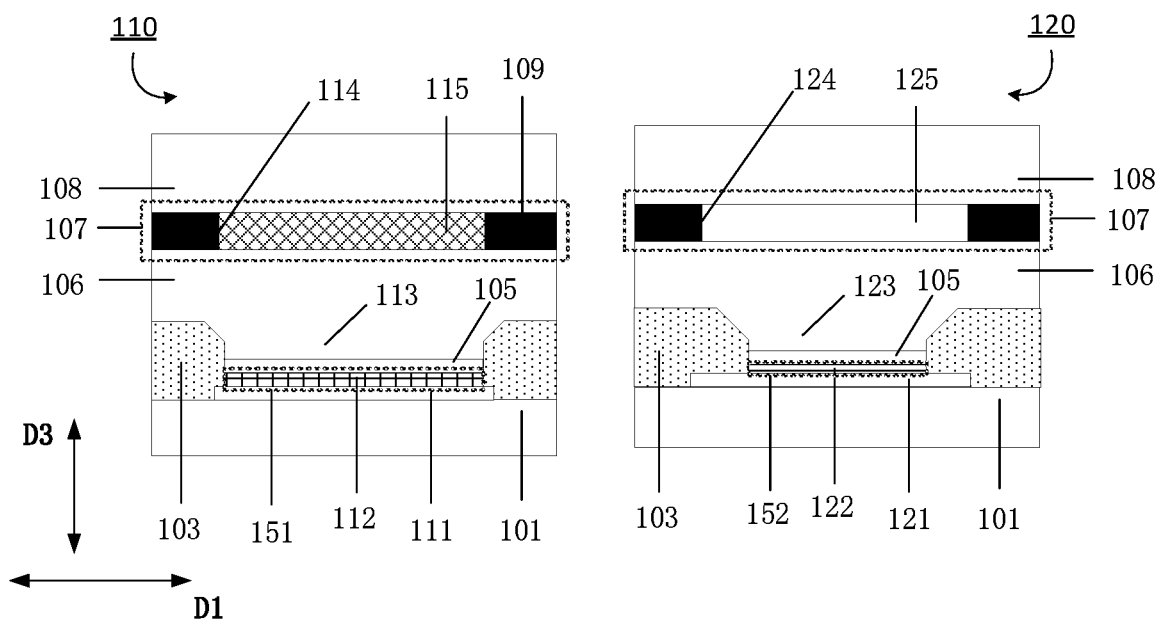
FIG. 4B is a partial cross-sectional schematic diagram of a first pixel unit and a second pixel unit shown in FIG. 4A.
Figure 4C:
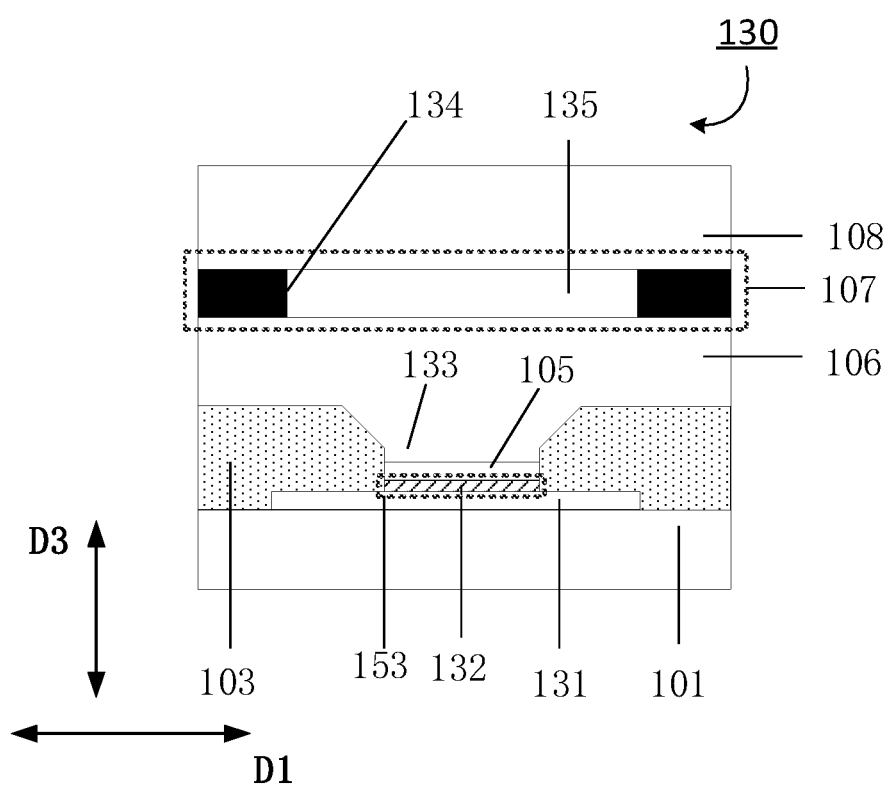
FIG. 4C is a partial cross-sectional schematic diagram of a third pixel unit shown in FIG. 4A.

FIG. 4B is a partial cross-sectional schematic diagram of the first pixel unit 110 and the second pixel unit 120 shown in FIG. 4A; and FIG. 4C is a partial cross-sectional schematic diagram of the third pixel unit 130 shown in FIG. 4A. The partial cross-sectional schematic diagram of the first pixel unit 110 and the second pixel unit 120 shown in FIG. 4B is obtained by respectively sectioning along a line A-A' and a line B-B' shown in FIG. 4A, and the partial cross-sectional schematic diagram of the third pixel unit 130 shown in FIG. 4C is obtained by sectioning along a line C-C' shown in FIG. 4A.

As illustrated in FIG. 4B, the first pixel unit 110 includes a first electrode 111, a first light-emitting layer 112 and an opposed electrode 105 that are stacked; and the second pixel unit 120 includes a second electrode 121, a second light-emitting layer 122 and an opposed electrode 105 that are stacked. As illustrated in FIG. 4C, the third pixel unit 130 includes a third electrode 131, a third light-emitting layer 132 and an opposed electrode 105 that are stacked.

For example, as illustrated in FIG. 4B and FIG. 4C, the first electrode 111, the second electrode 121 and the third electrode 131 are spaced apart and electrically insulated from each other. For example, the first electrode 111, the second electrode 121 and the third electrode 131 are respectively configured as an anode of the first pixel unit 110, an anode of the second pixel unit 120, and an anode of the third pixel unit 130.

For example, the first electrode 111, the second electrode 121 and the third electrode 131 may be formed with a same thin film layer and by using a same patterning process. For example, the first electrode 111, the second electrode 121 and the third electrode 131 may be formed by patterning a laminated layer of a first transparent conductive layer and a metal layer. For example, the first transparent conductive layer may be made of a transparent conductive oxide or other applicable materials; the transparent conductive oxide, for example, may include one or a combination of indium tin oxide (ITO), indium zinc oxide (IZO), zinc oxide (ZnO) and aluminum zinc oxide (AZO). For example, the metal layer may be made of a material (e.g., Al, Ag, Au, Ni or Pt) having a high reflectance with respect to light emitted from the light-emitting layer (the first light-emitting layer 112, the second light-emitting layer 122 and the third light-emitting layer 132). For example, the first electrode 111, the second electrode 121 and the third electrode 131 may reflect ambient light (e.g., visible light in the ambient light).

For example, the opposed electrode 105 of the first pixel unit 110, the opposed electrode 105 of the second pixel unit 120, and the opposed electrode 105 of the third pixel unit 130 are respectively configured as a cathode of the first pixel unit 110, a cathode of the second pixel unit 120, and a cathode of the third pixel unit 130. For example, the opposed electrode 105 of the first pixel unit 110, the opposed electrode 105 of the second pixel unit 120, and the opposed electrode 105 of the third pixel unit 130 may be formed with a same thin film layer and by using a same patterning process. For example, the opposed electrode 105 of the first pixel unit 110, the opposed electrode 105 of the second pixel unit 120, and the opposed electrode 105 of the third pixel unit 130 may be formed by patterning a second transparent conductive layer. For example, the second transparent conductive layer may be made of a transparent alloy material (e.g., Mg:Ag or Ca:Ag), a transparent conductive oxide material (e.g., ITO or AZO), a combination of a transparent alloy material and a transparent conductive oxide material (e.g., Mg:Ag/ITO) or other applicable materials.

It should be noted that, the opposed electrode 105 of the first pixel unit 110, the opposed electrode 105 of the second pixel unit 120, and the opposed electrode 105 of the third pixel unit 130 are not limited to being spaced apart and electrically insulated from each other. According to actual needs, the opposed electrode 105 of the first pixel unit 110, the opposed electrode 105 of the second pixel unit 120, and the opposed electrode 105 of the third pixel unit 130 may also be electrically connected with each other; in this situation, wiring design of the display substrate 100 may be simplified. For example, after the second transparent conductive layer is formed on the light-emitting layer, the second transparent conductive layer may not be patterned; in this situation, a fabrication process of the display substrate 100 may also be simplified.

The first light-emitting layer 112 emits first monochromatic light (e.g., blue light) under the driving of the first electrode 111 and the opposed electrode 105; the second light-emitting layer 122 emits second monochromatic light (e.g., red light) under the driving of the second electrode 121 and the opposed electrode 105; and the third light-emitting layer 132 emits third monochromatic light (e.g., green light) under the driving of the third electrode 131 and the opposed electrode 105. For example, a color of the first monochromatic light, a color of the second monochromatic light, and a color of the third monochromatic light are different from each other. For example, the first light-emitting layer 112, the second light-emitting layer 122 and the third light-emitting layer 132 are made of different materials in different processes.

For example, the first light-emitting layer 112 includes a first light-emitting material, the second light-emitting layer 122 includes a second light-emitting material, and the third light-emitting layer 132 includes a third light-emitting material. For example, luminous efficiency of the first light-emitting material is less than luminous efficiency of the second light-emitting material, and the luminous efficiency of the second light-emitting material is less than luminous efficiency of the third light-emitting material; that is, as driven by a same driving signal (e.g., driving current), an intensity of the first monochromatic light emitted by per unit area of the first light-emitting material is smaller than an intensity of the second monochromatic light emitted by per unit area of the second light-emitting material, and the intensity of the second monochromatic light emitted by per unit area of the second light-emitting material is smaller than an intensity of the third monochromatic light emitted by per unit area of the third light-emitting material.

For example, the first light-emitting material includes organic fluorescent light-emitting materials such as TBP, DSA-Ph, BD1 and BD2, or organic phosphorescent light-emitting materials such as FIrpic, FIrtaz and FIrN4; the second light-emitting material includes organic fluorescent light-emitting materials such as DCM, DCJTB, DCJ and DCJT, or organic phosphorescent light-emitting materials such as PtOEP, Btp2Ir(acac) and Ir(piq)2(acac); and the third light-emitting material includes organic fluorescent light-emitting materials such as C-545T (coumarin), C-545MT, quinacridone (QA) and polyaromatic hydrocarbons (PAH), or organic phosphorescent light-emitting materials such as Ir(ppy)3, Ir(mppy)3 and (ppy)2 Ir(acac).

As illustrated in FIG. 4B and FIG. 4C, the display substrate 100 further comprises a pixel defining layer 103. The pixel defining layer 103 is provided on a side, which is away from the base substrate 101, of the first electrode 111, the second electrode 121 and the third electrode 131, and the pixel defining layer 103 is formed with a first pixel opening 113, a second pixel opening 123 and a third pixel opening 133.

As illustrated in FIG. 4B, the first pixel unit 110 includes the first pixel opening 113, and at least a portion of the first electrode 111 and the first light-emitting layer 112 overlaps with the first pixel opening 113 in a direction directly facing a display side of the display substrate 100 (i.e., a third direction D3); the second pixel unit 120 includes the second pixel opening 123, and at least a portion of the second electrode 121 and the second light-emitting layer 122 overlaps with the second pixel opening 123 in the direction directly facing the display side of the display substrate 100. As illustrated in FIG. 4C, the third pixel unit 130 includes the third pixel opening 133, and at least a portion of the third electrode 131 and the third light-emitting layer 132 overlaps with the third pixel opening 133 in the direction directly facing the display side of the display substrate 100.

As illustrated in FIG. 4B and FIG. 4C, two ends of an electrode (the first electrode 111, the second electrode 121 or the third electrode 131) along the first direction D1 both overlap with the pixel defining layer 103. As illustrated in FIG. 4B and FIG. 4C, an overlapping area between the pixel defining layer 103 and the first electrode 111 is smaller than an overlapping area between the pixel defining layer 103 and the second electrode 121, and the overlapping area between the pixel defining layer 103 and the second electrode 121 is smaller than an overlapping area between the pixel defining layer 103 and the third electrode 131. For example, the area of the first electrode 111, the area of the second electrode 121, and the area of the third electrode 131 are all equal to each other.

As illustrated in FIG. 4B, the area of the effective light-emitting region 151 of the first light-emitting layer (i.e., the effective light-emitting area of the first light-emitting layer 112) is an area of the first light-emitting layer 112 that is in the first pixel opening 113. As illustrated in FIG. 4B, two surfaces, which are opposite to each other in the third direction D3, of the effective light-emitting region 151 of the first light-emitting layer are respectively in direct contact with the first electrode 111 and the opposed electrode 105, so the effective light-emitting region 151 of the first light-emitting layer, as driven by the first electrode 111 and the opposed electrode 105, may be used to emit the first monochromatic light. In some examples, the first light-emitting layer 112 further includes a region overlapping with the pixel defining layer 103 (not shown in FIG. 4B), and the region of the first light-emitting layer 112 that overlaps with the pixel defining layer 103 is provided on a side of the pixel defining layer 103 that is away from the first electrode 111, so the region of the first light-emitting layer 112 that overlaps with the pixel defining layer 103 is not in contact with the first electrode 111, and thus cannot be used to emit light (the first monochromatic light).

As illustrated in FIG. 4B, the area of the effective light-emitting region 151 of the second light-emitting layer (i.e., the effective light-emitting area of the second light-emitting layer 122) is an area of the second light-emitting layer 122 that is in the second pixel opening 123. As illustrated in FIG. 4B, two surfaces, which are opposite to each other in the third direction D3, of the effective light-emitting region 152 of the second light-emitting layer are respectively in direct contact with the second electrode 121 and the opposed electrode 105, so the effective light-emitting region 152 of the second light-emitting layer, as driven by the second electrode 121 and the opposed electrode 105, may be used to emit the second monochromatic light. In some examples, the second light-emitting layer 122 further includes a region overlapping with the pixel defining layer 103 (not shown in FIG. 4B), and the region of the second light-emitting layer 122 that overlaps with the pixel defining layer 103 is provided on a side of the pixel defining layer 103 that is away from the second electrode 121, so the region of the second light-emitting layer 122 that overlaps with the pixel defining layer 103 is not in contact with the second electrode 121, and thus cannot be used to emit light (the second monochromatic light).

As illustrated in FIG. 4C, the area of the effective light-emitting region 153 of the third light-emitting layer (i.e., the effective light-emitting area of the third light-emitting layer 132) is an area of the third light-emitting layer 132 that is in the third pixel opening 133. As illustrated in FIG. 4C, two surfaces, which are opposite to each other in the third direction D3, of the effective light-emitting region 153 of the third light-emitting layer are respectively in direct contact with the third electrode 131 and the opposed electrode 105, so the effective light-emitting region 153 of the third light-emitting layer, as driven by the third electrode 131 and the opposed electrode 105, may be used to emit the third monochromatic light. In some examples, the third light-emitting layer 132 further includes a region overlapping with the pixel defining layer 103 (not shown in FIG. 4C), and the region of the third light-emitting layer 132 that overlaps with the pixel defining layer 103 is provided on a side of the pixel defining layer 103 that is away from the third electrode 131, so the region of the third light-emitting layer 132 that overlaps with the pixel defining layer 103 is not in contact with the third electrode 131, and thus cannot be used to emit light (the third monochromatic light).

As illustrated in FIG. 4A to FIG. 4C, an area of a region of the first light-emitting layer 112 that is in direct contact with the first electrode 111, an area of a region of the second light-emitting layer 122 that is in direct contact with the second electrode 121, and an area of a region of the third light-emitting layer 132 that is in direct contact with the third electrode 131 are different from each other, so the area of the effective light-emitting region 151 of the first light-emitting layer, the area of effective light-emitting region 152 of the second light-emitting layer, and the area of effective light-emitting region 153 of the third light-emitting layer are different from each other.

For example, as illustrated in FIG. 4B and FIG. 4C, a size of the first pixel opening 113 is larger than a size of the second pixel opening 123, and the size of the second pixel opening 123 is larger than a size of the third pixel opening 133, so the area of the effective light-emitting region 151 of the first light-emitting layer is larger than the area of the effective light-emitting region 152 of the second light-emitting layer, and the area of the effective light-emitting region 152 of the second light-emitting layer is larger than the area of the effective light-emitting region 153 of the third light-emitting layer. In this case, a matching degree of maximum brightness of the first pixel unit 110 (e.g., a maximum value of an intensity of light that can be output by the pixel unit), maximum brightness of the second pixel unit 120, and maximum brightness of the third pixel unit 130 may be improved. For example, the light emitted by the first pixel unit 110, the light emitted by the second pixel unit 120, and the light emitted by the third pixel unit 130 may be mixed into white light.

For example, in a case where the first pixel unit 110, the second pixel unit 120 and the third pixel unit 130 are supplied with a same driving signal, brightness of the first pixel unit 110, brightness of the second pixel unit 120, and brightness of the third pixel unit 130 may match each other, which, thus, may not only avoid a problem of shortened service life of the first pixel unit 110 caused by overdriving the first pixel unit 110 (that is, an excessively high intensity of the driving signal supplied to the first pixel unit 110), but also avoid a problem of weak brightness of the third pixel unit 130 (caused by a driving signal received by the third pixel unit 130 being less than a design value in order to match the maximum brightness of the first pixel unit 110 and the second pixel unit 120).

As illustrated in FIG. 4B and FIG. 4C, the display substrate 100 further comprises a color filter layer 107; the color filter layer 107 is provided on a side, which is away from the base substrate 101, of the first light-emitting layer 112, the second light-emitting layer 122 and the third light-emitting layer 132, and the color filter layer 107 includes a black matrix 109; and the black matrix 109 is formed with a first black matrix opening 114, a second black matrix opening 124 and a third black matrix opening 134.

As illustrated in FIG. 4B, the first pixel unit 110 includes the first black matrix opening 114; and the first black matrix opening 114 overlaps with the first electrode 111 and the first light-emitting layer 112 in the direction directly facing the display side of the display substrate 100 and exposes the light reflection region of the first electrode 111. As illustrated in FIG. 4B, the second pixel unit 120 includes the second black matrix opening 124; and the second black matrix opening 124 overlaps with the second electrode 121 and the second light-emitting layer 122 in the direction directly facing the display side of the display substrate 100 and exposes the light reflection region of the second electrode 121. As illustrated in FIG. 4C, the third pixel unit 130 includes the third black matrix opening 134; and the third black matrix opening 134 overlaps with the third electrode 131 and the third light-emitting layer 132 in the direction directly facing the display side of the display substrate 100 and exposes the third light reflection region of the third electrode 131.

As illustrated in FIG. 4B, a size of the first black matrix opening 114 is equal to a size of the second black matrix opening 124, and the size of the second black matrix opening 124 is equal to a size of the third black matrix opening 134. The size of the first electrode 111 is larger than or equal to the size of the first black matrix opening 114, the size of the second electrode 121 is larger than or equal to the size of the second black matrix opening 124, and the size of the third electrode 131 is larger than or equal to the size of the third black matrix opening 134. A separation distance between the black matrix 109 and the first electrode 111 in the direction directly facing the display side of the display substrate 100 is equal to a separation distance between the black matrix 109 and the second electrode 121 in the direction directly facing the display side of the display substrate 100, and the separation distance between the black matrix 109 and the second electrode 121 in the direction directly facing the display side of the display substrate 100 is equal to a separation distance between the black matrix 109 and the third electrode 131 in the direction directly facing the display side of the display substrate 100. Therefore, as illustrated in FIG. 5A and FIG. 5B, the light-reflecting area of the first electrode 111 that is exposed in the first pixel unit 110 is equal to the light-reflecting area of the second electrode 121 that is exposed in the second pixel unit 120, and the light-reflecting area of the second electrode 121 that is exposed in the second pixel unit 120 is equal to the light-reflecting area of the third electrode 131 that is exposed in the third pixel unit 130.

It should be noted that, a light reflection region of an electrode (the first electrode 111, the second electrode 121 or the third electrode 131) refers to a region of an electrode as below, that is, a region that can receive ambient light, and can reflect the received ambient light through the black matrix 109 to, for example, a region at the display side of the display substrate 100. Therefore, an area of a light reflection region of the electrode (the first electrode 111, the second electrode 121 or the third electrode 131) is related to an incident angle of the ambient light, a distance between the black matrix 109 and the electrode, an opening area of the black matrix 109, and an area of the electrode.

Figure 5A:
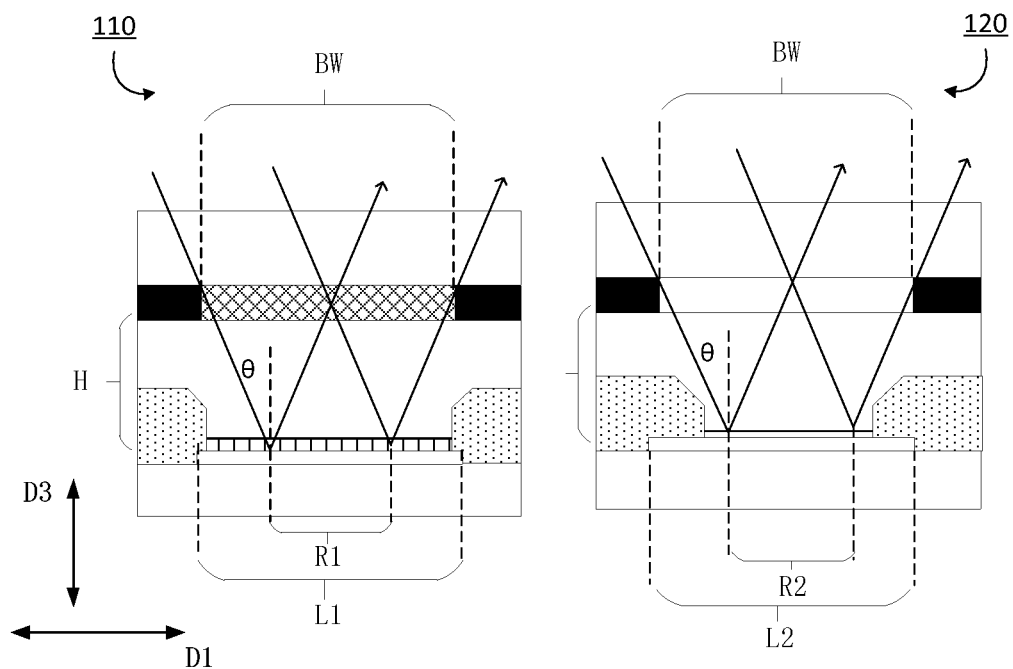
FIG. 5A is a schematic diagram of reflected light when ambient light is incident from a side face of the display substrate to a first electrode and a second electrode.
Figure 5B:
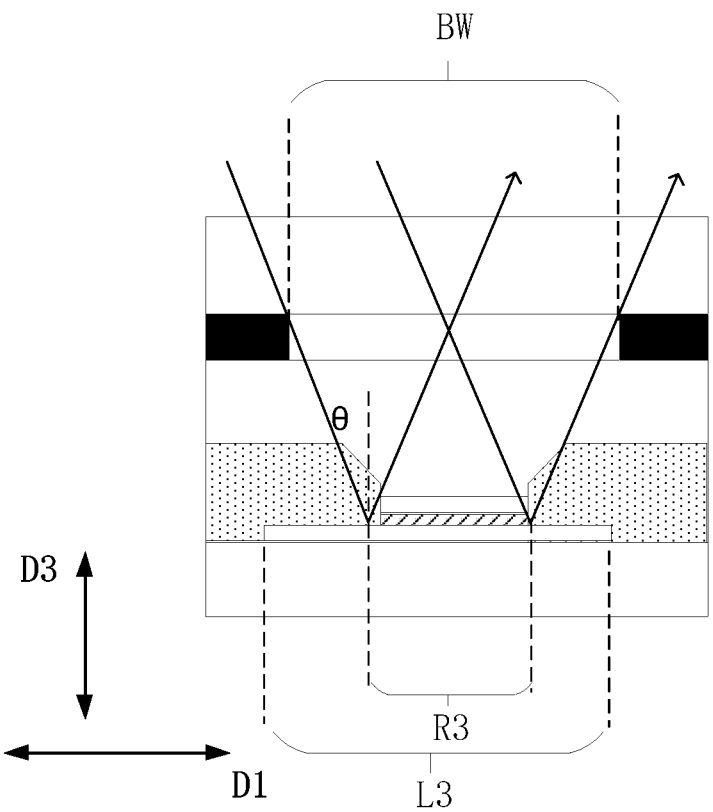
FIG. 5B is a schematic diagram of reflected light when ambient light is incident from the side face of the display substrate to a third electrode.

FIG. 5A is a schematic diagram of reflected light in the case where ambient light is incident from the side face of the display substrate to the first electrode and the second electrode; and FIG. 5B is a schematic diagram of reflected light in the case where ambient light is incident from the side face of the display substrate to the third electrode. It should be noted that, for the sake of clarity, reference signs are not shown in FIG. 5A and FIG. 5B, and reference signs illustrated in FIG. 4A and FIG. 4B may be referred to for the reference signs in FIG. 5A and FIG. 5B.

As illustrated in FIG. 5A and FIG. 5B, in a case where angles of the ambient light incident on the first electrode 111, the second electrode 121 and the third electrode 131 are equal to each other (all equal to θ), distances from the black matrix 109 to the first electrode 111, the second electrode 121 and the third electrode 131 are equal to each other (all equal to H), the size of the first black matrix opening 114, the size of the second black matrix opening 124, and the size of the third black matrix opening 134 are equal to each other (all equal to BW), and a size of an electrode (the first electrode 111, the second electrode 121 or the third electrode 131) is greater than or equal to a size of a corresponding opening of the black matrix 109, the area of the light reflection region of the first electrode 111, the area of the light reflection region of the second electrode 121, and the area of the light reflection region of the third electrode 131 are all equal to R=BW−2×H×tan θ (in a case where light is incident perpendicularly, R=BW). Thus, when the display picture provided by the display substrate 100 is observed at different incident angles with respect to the display substrate 100, the matching degree of the intensity of the ambient light reflected by the first pixel unit 110, the intensity of the ambient light reflected by the second pixel unit 120, and the intensity of the ambient light reflected by the third pixel unit 130 is improved. Therefore, the display substrate 100 provided by the embodiment of the present disclosure may suppress the color shift defect of the display substrate 100 and improve quality of the display picture displayed by the display substrate 100. For example, the ambient light reflected by the first pixel unit 110, the ambient light reflected by the second pixel unit 120, and the ambient light reflected by the third pixel unit 130 may be mixed to form white light. At this time, the display substrate 100 provided by the embodiment of the present disclosure may further suppress the color shift defect of the display substrate 100 and improve the quality of the display picture displayed by the display substrate 100.

It should be noted that, the ambient light incident to the first electrode 111, the second electrode 121 or the third electrode 131 may have a plurality of angles; because at any angle, the area of the light reflection region of the first electrode 111, the area of the light reflection region of the second electrode 121, and the area of the light reflection region of the third electrode 131, for example, are all equal to each other, the area of the light reflection region of the first electrode 111, the area of the light reflection region of the second electrode 121, and the area of the light reflection region of the third electrode 131 are still equal to each other.

It should be noted that, the display substrate 100 provided by the embodiment of the present disclosure is not limited to being arranged in the mode shown in FIG. 4A to FIG. 4C, that is, distances from the black matrix 109 to the first electrode 111, the second electrode 121 and the third electrode 131 are equal to each other (all equal to H), the size of the first black matrix opening 114, the size of the second black matrix opening 124, and the size of the third black matrix opening 134 are equal to each other (all equal to BW), and the size of the electrode (the first electrode 111, the second electrode 121 or the third electrode 131) is greater than or equal to the size of the corresponding opening of the black matrix 109; according to actual application needs, the distance between the black matrix 109 and the first electrode 111, the second electrode 121 or the third electrode 131, the size of the first black matrix opening 114, the size of the second black matrix opening 124, and the size of the third black matrix opening 134, as well as the size of the first electrode 111, the second electrode 121 or the third electrode 131 may also be set to other applicable numerical values, as long as the light-reflecting area of the first electrode 111 that is exposed in the first pixel unit 110, the light-reflecting area of the second electrode 121 that is exposed in the second pixel unit 120, and the light-reflecting area of the third electrode 131 that is exposed in the third pixel unit 130 are equal to each other. For example, in some examples, the size of the first black matrix opening 114 and the separation distance between the black matrix 109 and the first electrode 111 may be increased, while the light-reflecting area of the first electrode 111, the light-reflecting area of the second electrode 121, and the light-reflecting area of the third electrode 131 are maintained equal to each other.

For example, as illustrated in FIG. 4B and FIG. 4C, the display substrate 100 further comprises an encapsulation layer 106 and a protective layer 108. The encapsulation layer 106 is located between the opposed electrode 105 and the color filter layer 107, and is used to relieve a problem of materials of the opposed electrode 105 and the light-emitting layer (the first light-emitting layer 112, the second light-emitting layer 122 and the third light-emitting layer 132) being oxidized by water vapor or oxygen in the air. The encapsulation layer 106, for example, may be made of resin (polytetrafluoroethylene resin (TEF)). The protective layer 108 is located on a side of the color filter layer 107 that is away from the base substrate 101, and is used to prevent the color filter layer 107 from being scratched. The protective layer 108 is made of a material having a high transmittance (e.g., greater than 95%) with respect to visible light. For example, the protective layer 108 may also be used to enhance strength of the display substrate 100; in this situation, the protective layer 108 may be implemented as a glass substrate, a quartz substrate, or the like. For another example, the protective layer 108 may also be made of a flexible material such as plastic or resin.

For example, the base substrate 101 may be a transparent substrate or an opaque substrate. For example, the transparent substrate may be a glass substrate, a quartz substrate, a plastic substrate (e.g., a polyethylene terephthalate (PET) substrate), or a substrate made of other applicable material. For example, the opaque substrate may be a semiconductor substrate. For example, the base substrate 101 may be a flexible base substrate 101 or an inflexible rigid base substrate 101. The flexible base substrate 101 may be a metal foil, thin glass, or a plastic substrate (e.g., a substrate made of polyimide), and the inflexible rigid base substrate 101 may be a glass substrate or a semiconductor base substrate 101.

For example, as illustrated in FIG. 4B and FIG. 4C, the color filter layer 107 further includes a first filter 115, a second filter 125 and a third filter 135. The first filter 115 is provided in the first black matrix opening 114, the second filter 125 is provided in the second black matrix opening 124, and the third filter 135 is provided in the third black matrix opening 134. A color of the first filter 115 is the same as the color of the first monochromatic light, and the first filter 115 has a high transmittance with respect to the first monochromatic light (e.g., the transmittance with respect to the first monochromatic light is greater than 95%). A color of the second filter 125 is the same as the color of the second monochromatic light, and the second filter 125 has a high transmittance with respect to the second monochromatic light (e.g., the transmittance with respect to the second monochromatic light is greater than 95%). A color of the third filter 135 is the same as the color of the third monochromatic light, and the third filter 135 has a high transmittance with respect to the third monochromatic light (e.g., the transmittance with respect to the third monochromatic light is greater than 95%).

For example, as illustrated in FIG. 5A, the first electrode 111 may reflect ambient light (e.g., visible light in the ambient light), and thus, when the ambient light is incident on the first electrode 111, at least a portion of the ambient light is reflected by the first electrode 111 onto the first filter 115, and the first filter 115 may filter out light having a color different from the first monochromatic light in the ambient light, and may transmit light having a color the same as the first monochromatic light in the ambient light. Therefore, the first filter 115 may reduce an intensity of the ambient light reflected by the first electrode 111, and thus may improve contrast of a display image of the display substrate 100. In this situation, the first pixel unit 110 shown in FIG. 5A does not have to be provided with a polarizer (e.g., a circular polarizer) on a side of the protective layer 108 that is away from the first light-emitting layer 112, which, thus, may prevent the polarizer from absorbing light emitted from the first light-emitting layer 112, and may enhance display brightness of the first pixel unit 110 (e.g., a maximum value of an intensity of the light emergent from the first pixel unit 110).

For example, the second filter 125 may filter out light having a color different from the second monochromatic light in the ambient light, and may transmit light having a color the same as the second monochromatic light in the ambient light; the third filter 135 may filter out light having a color different from the third monochromatic light in the ambient light, and may transmit light having a color the same as the third monochromatic light in the ambient light; and thus, the second pixel unit 120 shown in FIG. 5B and the third pixel unit 130 shown in FIG. 5C do not have to be provided with a polarizer (e.g., a circular polarizer) on a side of the protective layer 108 that is away from the base substrate 101, and thus, may increase display brightness of the second pixel unit 120 (e.g., a maximum value of an intensity of the light emergent from the second pixel unit 120), and display brightness of the third pixel unit 130 (e.g., a maximum value of an intensity of the light emergent from the third pixel unit 130).

Several points below need to be explained:

(1) The display substrate 100 provided by the embodiment of the present disclosure is not limited to comprising the first pixel unit 110, the second pixel unit 120 and the third pixel unit 130. For example, the display substrate 100 may only comprise the first pixel unit 110 and the second pixel unit 120. For another example, according to actual application needs, the display substrate 100 may further comprise a fourth pixel unit; the fourth pixel unit emits a fourth monochromatic light; and a color of the fourth monochromatic light is different from the color of the first monochromatic light, the color of the second monochromatic light, and the color of the third monochromatic light.

(2) The effective light-emitting area of the third light-emitting layer is not limited to being smaller than the effective light-emitting area of the second light-emitting layer; for example, in the case where the luminous efficiency of the third light-emitting material is equal to the luminous efficiency of the second light-emitting material, the effective light-emitting area of the third light-emitting layer may also be equal to the effective light-emitting area of the second light-emitting layer.

(3) That the light-reflecting area of the first electrode 111, the light-reflecting area of the second electrode 121, and the light-reflecting area of the third electrode 131 are equal to each other, for example, refers to that the light-reflecting area of the first electrode 111, the light-reflecting area of the second electrode 121, and the light-reflecting area of the third electrode 131 have an equal design value. In actual production, the light-reflecting area of the first electrode 111, the light-reflecting area of the second electrode 121, and the light-reflecting area of the third electrode 131 may slightly deviate from the design value due to process errors.

(4) Although the color shift defect of the display substrate 100 may be better suppressed by enabling the light-reflecting area of the first electrode 111, the light-reflecting area of the second electrode 121, and the light-reflecting area of the third electrode 131 to be equal to each other, yet those skilled in the art may understand that, even in a case where the light-reflecting area of the first electrode 111, the light-reflecting area of the second electrode 121, and the light-reflecting area of the third electrode 131 are not completely equal to each other, the color shift defect of the display substrate 100 may also be suppressed to a certain extent. For example, the light-reflecting area of the second electrode 121 shown in FIG. 4B may be larger than the light-reflecting area of the second electrode 121 shown in FIG. 3A but smaller than the light-reflecting area of the first electrode 111 shown in FIG. 4B; in this situation, although the display substrate 100 shown in FIG. 4A still has certain color shift, yet the color shift defect of the display substrate 100 shown in FIG. 4A is improved to a certain extent as compared with the display substrate 100 shown in FIG. 1. Since those skilled in the art can obtain the above-described technical solution without any inventive work, the above-described technical solution should also be within the protection scope of the present disclosure.

(5) The arrangement mode of the first pixel unit 110, the second pixel unit 120 and the third pixel unit 130 shown in FIG. 4A is only an example; and according to actual application needs, the first pixel unit 110, the second pixel unit 120 and the third pixel unit 130 may also be arranged in other mode.

(6) Although the area of the effective light-emitting region 151 of the first light-emitting layer (e.g., in a case where light is normally incident) is equal to the area of the first electrode 111 as illustrated in FIG. 4A, yet the embodiment of the present disclosure is not limited thereto. For example, in the case where light is normally incident, the area of the effective light-emitting region 151 of the first light-emitting layer may be smaller than the area of the first electrode 111.

(7) The transmittances of the pixel defining layer with respect to the light emitted from the first light-emitting layer 112, the second light-emitting layer 122 and the third light-emitting layer 132 as well as the ambient light may be set according to actual application needs. For example, the transmittances of the pixel defining layer with respect to the light emitted from the first light-emitting layer 112, the second light-emitting layer 122 and the third light-emitting layer 132 as well as the ambient light are relatively high (e.g., greater than 90%), in this case, the pixel defining layer is transparent; since the pixel defining layer is transparent, the ambient light may enter the first electrode 111, the second electrode 121 and the third electrode 131 through the pixel defining layer, and light reflected by the first electrode 111, the second electrode 121 and the third electrode 131 may also leave the display substrate 100 through the transparent pixel defining layer, so that the area of the light reflection region of the first electrode 111, the area of the light reflection region of the second electrode 121, and the area of the light reflection region of the third electrode 131 may be equal to each other.

Figure 6A:
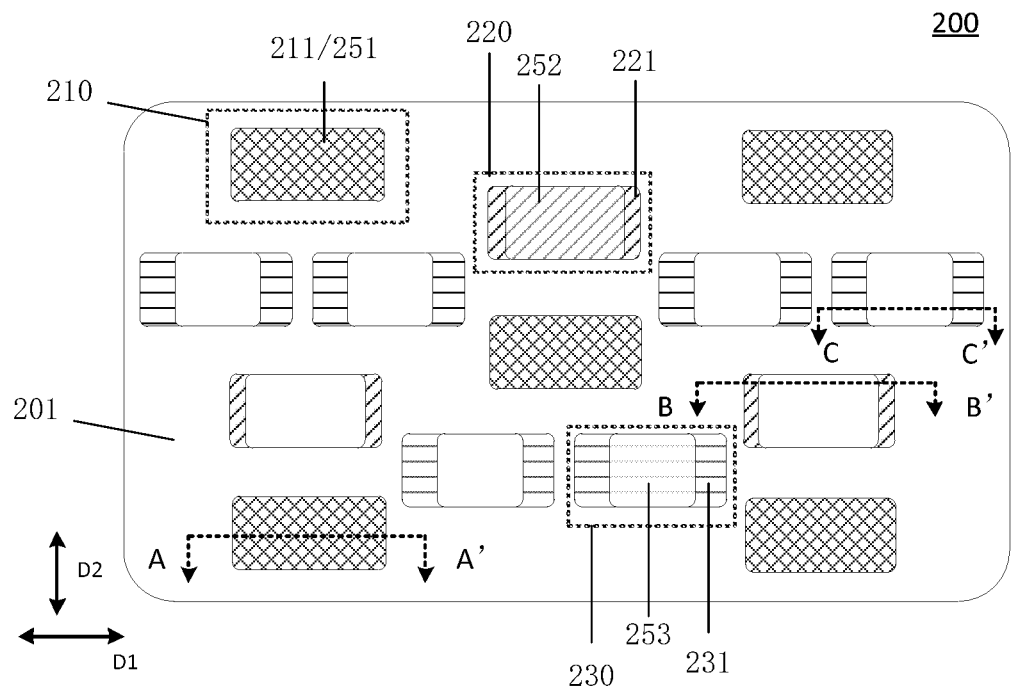
FIG. 6A is a schematic plan view of another display substrate provided by at least one embodiment of the present disclosure.

FIG. 6A shows a schematic plan view of another display substrate 200 provided by at least one embodiment of the present disclosure. As illustrated in FIG. 6A, the display substrate 200 comprises a base substrate 201 as well as a first pixel unit 210, a second pixel unit 220 and a third pixel unit 230 arranged on the base substrate 201. For example, the first pixel unit 210, the second pixel unit 220 and the third pixel unit 230 are arranged on the base substrate 201 respectively along a first direction D1 and a second direction D2. As illustrated in FIG. 6A, an area of an effective light-emitting region 251 of a first light-emitting layer is larger than an area of an effective light-emitting region 252 of a second light-emitting layer, and the area of the effective light-emitting region 252 of the second light-emitting layer is larger than an effective light-emitting region 253 of a third light-emitting layer; a light-reflecting area of a first electrode 211 that is exposed in the first pixel unit 210, a light-reflecting area of a second electrode 221 that is exposed in the second pixel unit 220, and a light-reflecting area of a third electrode 231 that is exposed in the third pixel unit 230 are equal to each other. Hereinafter, it is specifically described in conjunction with FIG. 6B and FIG. 6C.

Figure 6B:
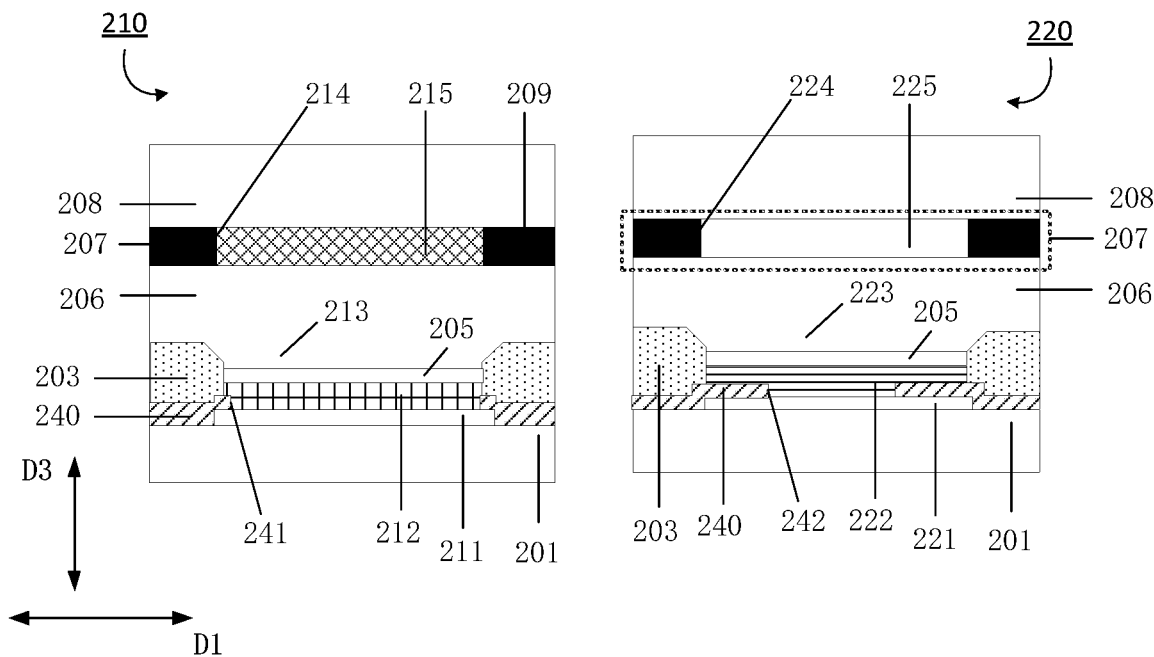
FIG. 6B is a partial cross-sectional schematic diagram of a first pixel unit and a second pixel unit of another display substrate shown in FIG. 6A.
Figure 6C:
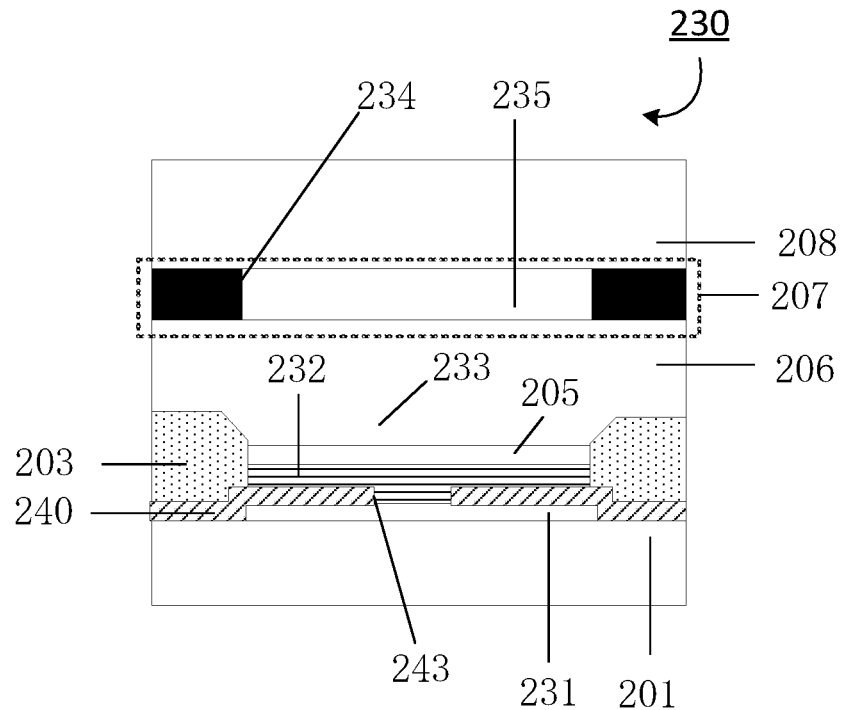
FIG. 6C is a partial cross-sectional schematic diagram of a third pixel unit of another display substrate shown in FIG. 6A.

FIG. 6B is a partial cross-sectional schematic diagram of the first pixel unit 210 and the second pixel unit 220 of another display substrate 200 shown in FIG. 6A; and FIG. 6C is a partial cross-sectional schematic diagram of the third pixel unit 230 of another display substrate 200 shown in FIG. 6A. The partial cross-sectional schematic diagram of the first pixel unit 210 and the second pixel unit 220 shown in FIG. 6B is obtained by respectively sectioning along a line A-A' and a line B-B' shown in FIG. 6A, and the partial cross-sectional schematic diagram of the third pixel unit 230 shown in FIG. 6C is obtained by sectioning along a line C-C' shown in FIG. 6A.

As illustrated in FIG. 6B, the first pixel unit 210 includes a first electrode 211, a first light-emitting layer 212 and an opposed electrode 205 that are stacked; the second pixel unit 220 includes a second electrode 221, a second light-emitting layer 222 and an opposed electrode 205 that are stacked. As illustrated in FIG. 6C, the third pixel unit 230 includes a third electrode 231, a third light-emitting layer 232 and an opposed electrode 205 that are stacked. For example, as illustrated in FIG. 6B and FIG. 6C, the first electrode 211, the second electrode 221 and the third electrode 231 are spaced apart and electrically insulated from each other.

For example, the first electrode 211, the second electrode 221 and the third electrode 231 are respectively configured as an anode of the first pixel unit 210, an anode of the second pixel unit 220, and an anode of the third pixel unit 230; the opposed electrode 205 of the first pixel unit 210, the opposed electrode 205 of the second pixel unit 220, and the opposed electrode 205 of the third pixel unit 230 are respectively configured as a cathode of the first pixel unit 210, a cathode of the second pixel unit 220, and a cathode of the third pixel unit 230. The first light-emitting layer 212, the second light-emitting layer 222 and the third light-emitting layer 232 are respectively configured to emit a first monochromatic light, a second monochromatic light and a third monochromatic light; a color of the first monochromatic light, a color of the second monochromatic light, and a color of the third monochromatic light are different from each other. For example, the example shown in FIG. 4A may be referred to for a specific arrangement mode of the first electrode 211, the second electrode 221, the third electrode 231, the opposed electrode 205, the first light-emitting layer 212, the second light-emitting layer 222 and the third light-emitting layer 232, and no details will be repeated here.

As illustrated in FIG. 6B and FIG. 6C, the display substrate 200 further comprises a transparent insulating layer 240. The transparent insulating layer 240 is provided on a side, which is away from the base substrate 201, of the first electrode 211, the second electrode 221 and the third electrode 231, and the transparent insulating layer 240 is formed with a first insulating layer opening 241, a second insulating layer opening 242 and a third insulating layer opening 243.

As illustrated in FIG. 6B, the first pixel unit 210 includes the first insulating layer opening 241, and at least a portion of the first electrode 211 and the first light-emitting layer 212 overlaps with the first insulating layer opening 241 in a direction directly facing a display side of the display substrate 200 (i.e., a third direction D3); the second pixel unit 220 includes the second insulating layer opening 242, and at least a portion of the second electrode 221 and the second light-emitting layer 222 overlaps with the second insulating layer opening 242 in the direction directly facing the display side of the display substrate 200. As illustrated in FIG. 6C, the third pixel unit 230 includes the third insulating layer opening 243, and at least a portion of the third electrode 231 and the third light-emitting layer 232 overlaps with the third insulating layer opening 243 in the direction directly facing the display side of the display substrate 200.

As illustrated in FIG. 6B and FIG. 6C, two ends of an electrode (the first electrode 211, the second electrode 221 or the third electrode 231) along the first direction D1 both overlaps with the transparent insulating layer 240. An overlapping area between the transparent insulating layer 240 and the first electrode 211 is smaller than an overlapping area between the transparent insulating layer 240 and the second electrode 221, and the overlapping area between the transparent insulating layer 240 and the second electrode 221 is smaller than an overlapping area between the transparent insulating layer 240 and the third electrode 231. For example, the area of the first electrode 211, the area of the second electrode 221 and the area of the third electrode 231 are all equal to each other.

As illustrated in FIG. 6B, the area of the effective light-emitting region 251 of the first light-emitting layer (i.e., an effective light-emitting area of the first light-emitting layer 212) is an area of the first light-emitting layer 212 that is in the first insulating layer opening 241. As illustrated in FIG. 6B, two surfaces, which are opposite to each other in the third direction D3, of the effective light-emitting region 251 of the first light-emitting layer are respectively in direct contact with the first electrode 211 and the opposed electrode 205, so the effective light-emitting region 251 of the first light-emitting layer, as driven by the first electrode 211 and the opposed electrode 205, may be used to emit the first monochromatic light.

As illustrated in FIG. 6B, the area of the effective light-emitting region 252 of the second light-emitting layer (i.e., an effective light-emitting area of the second light-emitting layer 222) is an area of the second light-emitting layer 222 that is in the second insulating layer opening 242. As illustrated in FIG. 6B, two surfaces, which are opposite to each other in the third direction D3, of the effective light-emitting region 252 of the second light-emitting layer are respectively in direct contact with the second electrode 221 and the opposed electrode 205, so the effective light-emitting region 252 of the second light-emitting layer, as driven by the second electrode 221 and the opposed electrode 205, may be used to emit the second monochromatic light.

As illustrated in FIG. 6C, the area of the effective light-emitting region 253 of the third light-emitting layer (i.e., an effective light-emitting area of the third light-emitting layer 232) is an area of the third light-emitting layer 232 that is in the third insulating layer opening 243. As illustrated in FIG. 6C, two surfaces, which are opposite to each other in the third direction D3, of the effective light-emitting region 253 of the third light-emitting layer are respectively in direct contact with the third electrode 231 and the opposed electrode 205, so the effective light-emitting region 253 of the third light-emitting layer, as driven by the third electrode 231 and the opposed electrode 205, may be used to emit the third monochromatic light.

As illustrated in FIG. 6A to FIG. 6C, an area of a region of the first light-emitting layer 212 that is in direct contact with the first electrode 211, an area of a region of the second light-emitting layer 222 that is in direct contact with the second electrode 221, and an area of a region of the third light-emitting layer 232 that is in direct contact with the third electrode 231 are different from each other, so the area of the effective light-emitting region 251 of the first light-emitting layer, the area of the effective light-emitting region 252 of the second light-emitting layer, and the area of the effective light-emitting region 253 of the third light-emitting layer are different from each other.

For example, as illustrated in FIG. 6B and FIG. 6C, a size of the first insulating layer opening 241 is larger than a size of the second insulating layer opening 242, and the size of the second insulating layer opening 242 is larger than a size of the third insulating layer opening 243, so the area of the effective light-emitting region 251 of the first light-emitting layer is larger than the area of the effective light-emitting region 252 of the second light-emitting layer, and the area of the effective light-emitting region 252 of the second light-emitting layer is larger than the area of the effective light-emitting region 253 of the third light-emitting layer. In this case, a matching degree of maximum brightness of the first pixel unit 210, maximum brightness of the second pixel unit 220, and maximum brightness of the third pixel unit 230 may be improved. For example, the light emitted by the first pixel unit 210, the light emitted by the second pixel unit 220, and the light emitted by the third pixel unit 230 may be mixed into white light.

For example, in a case where the first pixel unit 210, the second pixel unit 220 and the third pixel unit 230 are supplied with a same driving signal, brightness of the first pixel unit 210, brightness of the second pixel unit 220, and brightness of the third pixel unit 230 may match each other, which, thus, may not only avoid a problem of shortened service life of the first pixel unit 210 caused by overdriving the first pixel unit 210 (that is, a driving signal with an excessively high intensity is supplied to the first pixel unit 210), but also avoid a problem of weak brightness of the third pixel unit 230 (caused by a driving signal received by the third pixel unit 230 being less than a design value in order to match the maximum brightness of the first pixel unit 210 and the second pixel unit 220).

Figure 6D:
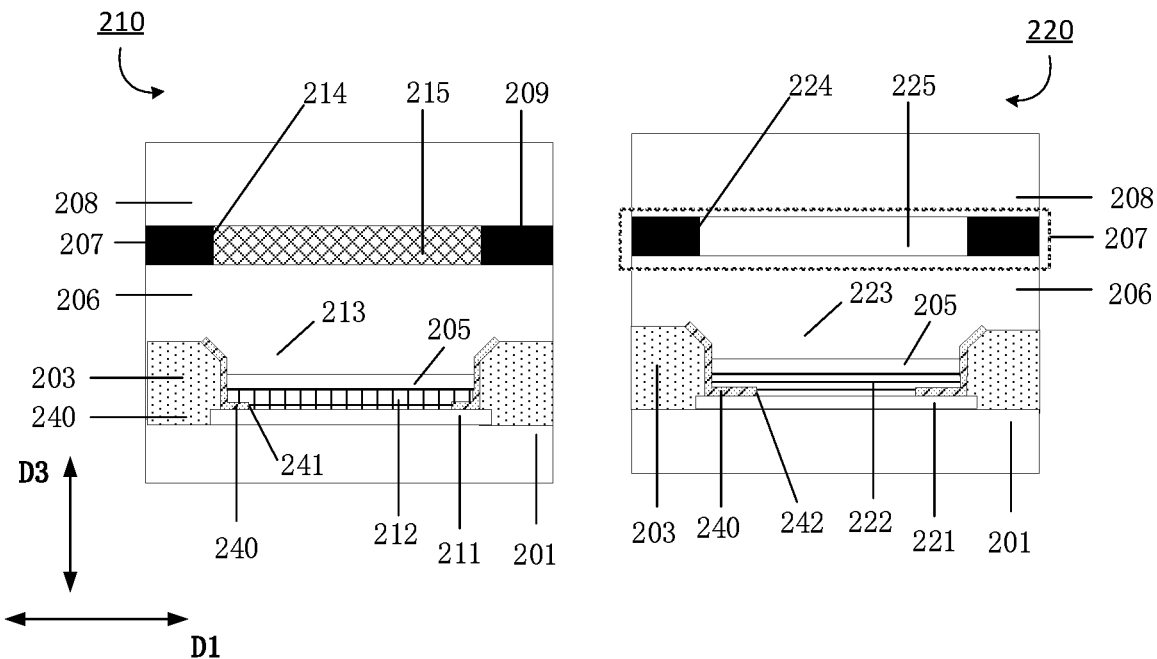
FIG. 6D is another partial cross-sectional schematic diagram of the first pixel unit and the second pixel unit of another display substrate shown in FIG. 6A.

As illustrated in FIG. 6B and FIG. 6C, the display substrate 200 further comprises a pixel defining layer 203. As illustrated in FIG. 6B and FIG. 6C, the pixel defining layer 203 is provided on a side of the transparent insulating layer 240 that is away from the base substrate 201, in this case, the electrode layer in which the first electrode 211 and the second electrode 221 are located, the transparent insulating layer 240 and the pixel defining layer 203 are sequentially arranged in a direction perpendicular to the base substrate 201; the electrode layer in which the first electrode 211 and the second electrode 221 are located, the transparent insulating layer 240, the pixel defining layer 203, and the layer in which the first light-emitting layer 212 and the second light-emitting layer 222 are located are sequentially formed on the base substrate 201; but the embodiment of the present disclosure is not limited thereto. In some examples, as illustrated in FIG. 6D, the pixel defining layer 203 may also be provided on a side of the transparent insulating layer 240 that is close to the base substrate 201. In this case, the electrode layer in which the first electrode 211 and the second electrode 221 are located, the pixel defining layer 203 and the transparent insulating layer 240 are sequentially arranged in the direction perpendicular to the base substrate 201; the electrode layer in which the first electrode 211 and the second electrode 221 are located, the pixel defining layer 203, the transparent insulating layer 240, and the layer in which the first light-emitting layer 212 and the second light-emitting layer 222 are located are sequentially formed on the base substrate 201.

As illustrated in FIG. 6B and FIG. 6C, the pixel defining layer 203 is formed with a first pixel opening 213, a second pixel opening 223 and a third pixel opening 233. As illustrated in FIG. 6B, the effective light-emitting area of the first light-emitting layer 212 is smaller than a size of the first pixel opening 213, and the effective light-emitting area of the second light-emitting layer 222 is smaller than a size of the second pixel opening 223. As illustrated in FIG. 6C, the effective light-emitting area of the third light-emitting layer 232 is smaller than a size of the third pixel opening 233. For example, the size of the first pixel opening 213, the size of the second pixel opening 223, and the size of the third pixel opening 233 are equal to each other; in this situation, difficulties in fabricating the mask for forming the first pixel opening 213, the second pixel opening 223 and the third pixel opening 233 may be reduced.

As illustrated in FIG. 6B and FIG. 6C, the display substrate 200 further comprises a color filter layer 207; the color filter layer 207 is provided on a side of the opposed electrode 205 that is away from the base substrate 201 and includes a black matrix 209; and the black matrix 209 is formed with a black matrix opening 214, a second black matrix opening 224 and a third black matrix opening 234.

As illustrated in FIG. 6B, the first pixel unit 210 includes the first black matrix opening 214; and the first black matrix opening 214 overlaps with the first electrode 211 and the first light-emitting layer 212 in the direction directly facing the display side of the display substrate 200 and exposes the light reflection region of the first electrode 211. As illustrated in FIG. 6B, the second pixel unit 220 includes the second black matrix opening 224; and the second black matrix opening 224 overlaps with the second electrode 221 and the second light-emitting layer 222 in the direction directly facing the display side of the display substrate 200 and exposes the light reflection region of the second electrode 221. As illustrated in FIG. 6C, the third pixel unit 230 includes the third black matrix opening 234; and the third black matrix opening 234 overlaps with the third electrode 231 and the third light-emitting layer 232 in the direction directly facing the display side of the display substrate 200 and exposes the light reflection region of the third electrode 231.

As illustrated in FIG. 6B and FIG. 6C, in a case where distances from the black matrix 209 to the first electrode 211, the second electrode 221 and the third electrode 231 are equal to each other (all equal to H), a size of the first black matrix opening 214, a size of the second black matrix opening 224, and a size of the third black matrix opening 234 are equal to each other (all equal to BW), a size of an electrode (the first electrode 111, the second electrode 121 or the third electrode 131) is greater than or equal to a size of a corresponding black matrix opening, and angles of the ambient light incident on the first electrode 211, the second electrode 221 and the third electrode 231 are equal to each other (all equal to θ), the area of the light reflection region of the first electrode 211, the area of the light reflection region of the second electrode 221, and the area of the light reflection region of the third electrode 231 are all equal to R=BW−2×H×tan θ. Thus, when a display picture provided by the display substrate 200 is observed at different incident angles with respect to the display substrate 200, a matching degree of an intensity of the ambient light reflected by the first pixel unit 210, an intensity of the ambient light reflected by the second pixel unit 220, and an intensity of the ambient light reflected by the third pixel unit 230 is improved. Therefore, the display substrate 200 provided by the embodiment of the present disclosure may suppress a color shift defect of the display substrate 200 and improve quality of the display picture displayed by the display substrate 200. For example, the ambient light reflected by the first pixel unit 210, the ambient light reflected by the second pixel unit 220, and the ambient light reflected by the third pixel unit 230 may be mixed to form white light; in this situation, the display substrate 200 provided by the embodiment of the present disclosure may further suppress the color shift defect of the display substrate 200 and improve the quality of the display picture displayed by the display substrate 200.

For example, the display substrate 200 according to the embodiment of the present disclosure may also adopt other arrangement mode such that the area of the light reflection region of the first electrode 211, the area of the light reflection region of the second electrode 221, and the area of the light reflection region of the third electrode 231 are equal to each other, for which the display substrate shown in FIG. 4A may be referred to specifically, and no details will be repeated here.

For example, as illustrated in FIG. 6B and FIG. 6C, the color filter layer further includes a first filter 215, a second filter 225 and a third filter 235. The first filter 215 is provided in the first black matrix opening 214, the second filter 225 is provided in the second black matrix opening 224, and the third filter 235 is provided in the third black matrix opening 234. A color of the first filter 215 is the same as the color of the first monochromatic light, and the first filter 215 has a high transmittance with respect to the first monochromatic light (e.g., the transmittance with respect to the first monochromatic light is greater than 95%). A color of the second filter 225 is the same as the color of the second monochromatic light, and the second filter 225 has a high transmittance with respect to the second monochromatic light (e.g., the transmittance with respect to the second monochromatic light is greater than 95%). A color of the third filter 235 is the same as the color of the third monochromatic light, and the third filter 235 has a high transmittance with respect to the third monochromatic light (e.g., the transmittance with respect to the third monochromatic light is greater than 95%).

For example, as illustrated in FIG. 6B and FIG. 6C, the display substrate further comprises an encapsulation layer 206 and a protective layer 208. The encapsulation layer 206 is located between the opposed electrode 205 and the color filter layer 207, and is used to relieve a problem of materials of the opposed electrode 105 and the light-emitting layer (the first light-emitting layer 212, the second light-emitting layer 222 and the third light-emitting layer 232) being oxidized by water vapor or oxygen in the air. The protective layer 208 is located on a side of the color filter layer 207 that is away from the base substrate 201, and is used to prevent the color filter layer 207 from being scratched. The protective layer 208 is made of a material having a high transmittance (e.g., greater than 95%) with respect to visible light.

It should be noted that, with respect to the display substrate shown in FIG. 6A, the transparent insulating layer 240 may not be provided; in this situation, the size of the first pixel opening, the size of the second pixel opening, and the size of the third pixel opening are equal to each other; the effective light-emitting area of the first light-emitting layer is the area of the first light-emitting layer, the effective light-emitting area of the second light-emitting layer is the area of the second light-emitting layer, and the effective light-emitting area of the third light-emitting layer is the area of the third light-emitting layer. For example, requirements on fabrication accuracy of the first light-emitting layer, the second light-emitting layer and the third light-emitting layer are relatively high.

Figure 7A:
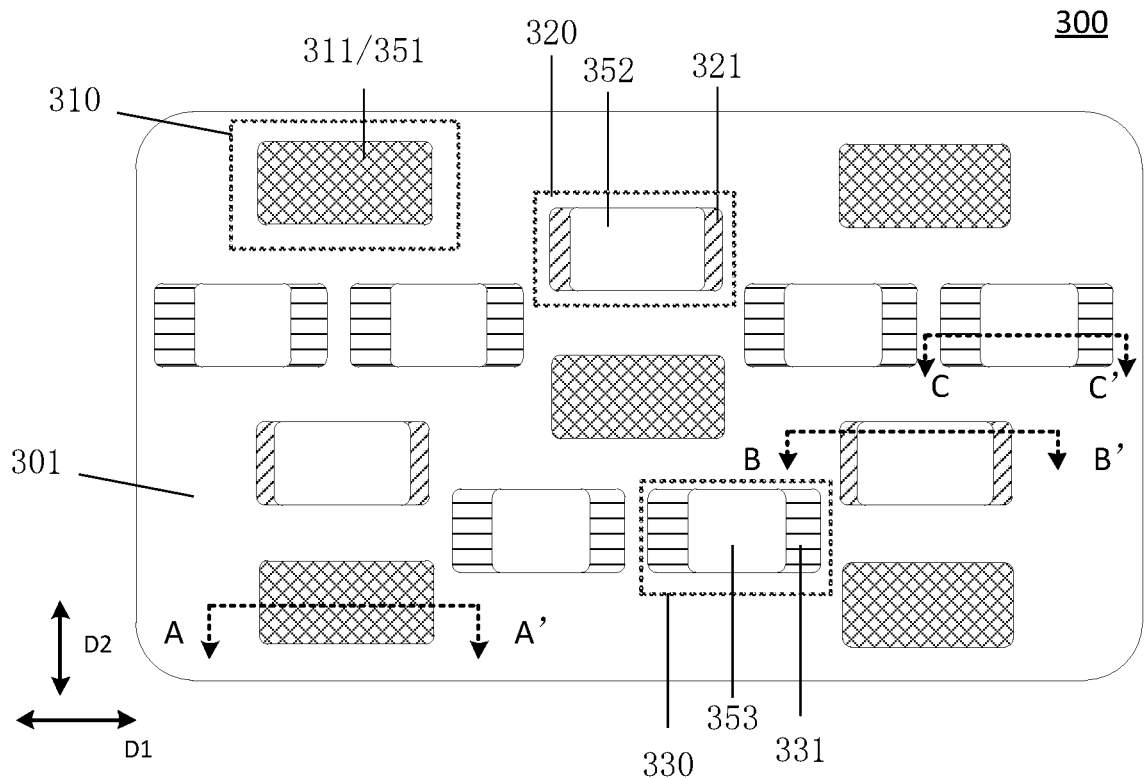
FIG. 7A is a schematic plan view of still another display substrate provided by at least one embodiment of the present disclosure.

FIG. 7A shows a schematic plan view of another display substrate 300 provided by at least one embodiment of the present disclosure. As illustrated in FIG. 7A, the display substrate 300 comprises a base substrate 301 as well as a first pixel unit 310, a second pixel unit 320 and a third pixel unit 330 arranged on the base substrate 301. For example, the first pixel unit 310, the second pixel unit 320 and the third pixel unit 330 are arranged on the base substrate 301 respectively along a first direction D1 and a second direction D2. As illustrated in FIG. 7A, an area of an effective light-emitting region 351 of a first light-emitting layer is larger than an area of an effective light-emitting region 352 of a second light-emitting layer, and the area of the effective light-emitting region 352 of the second light-emitting layer is larger than an area of an effective light-emitting region 353 of a third light-emitting layer; a light-reflecting area of a first electrode 311 that is exposed in the first pixel unit 310, a light-reflecting area of a second electrode 321 that is exposed in the second pixel unit 320, and a light-reflecting area of a third electrode 331 that is exposed in the third pixel unit 330 are equal to each other. Hereinafter, it is specifically described in conjunction with FIG. 7B and FIG. 7C.

Figure 7B:
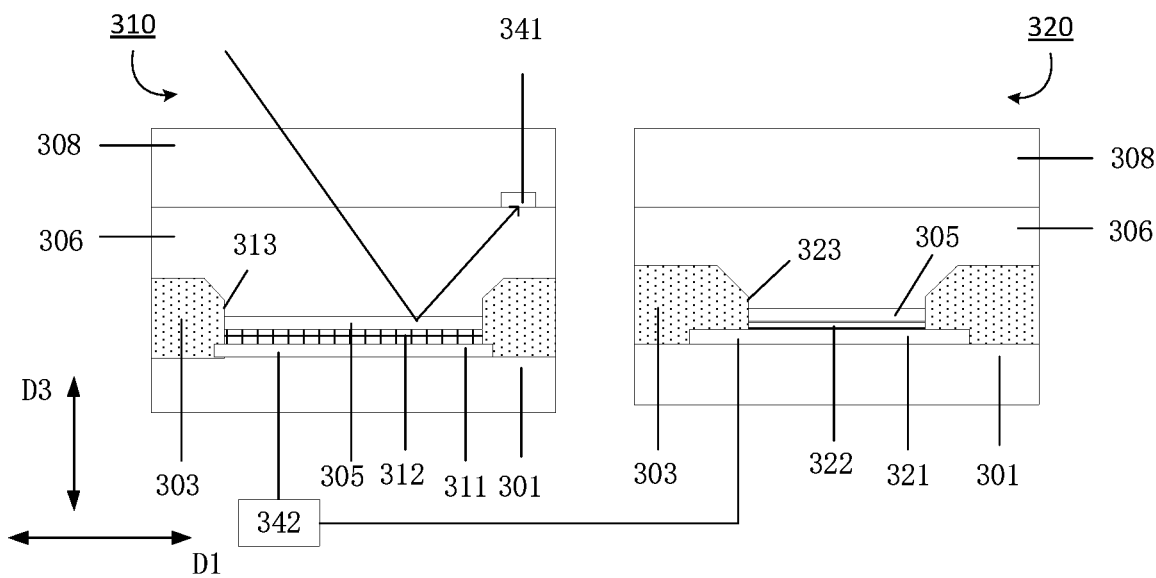
FIG. 7B is a partial cross-sectional schematic diagram of a first pixel unit and a second pixel unit of still another display substrate shown in FIG. 7A.
Figure 7C:
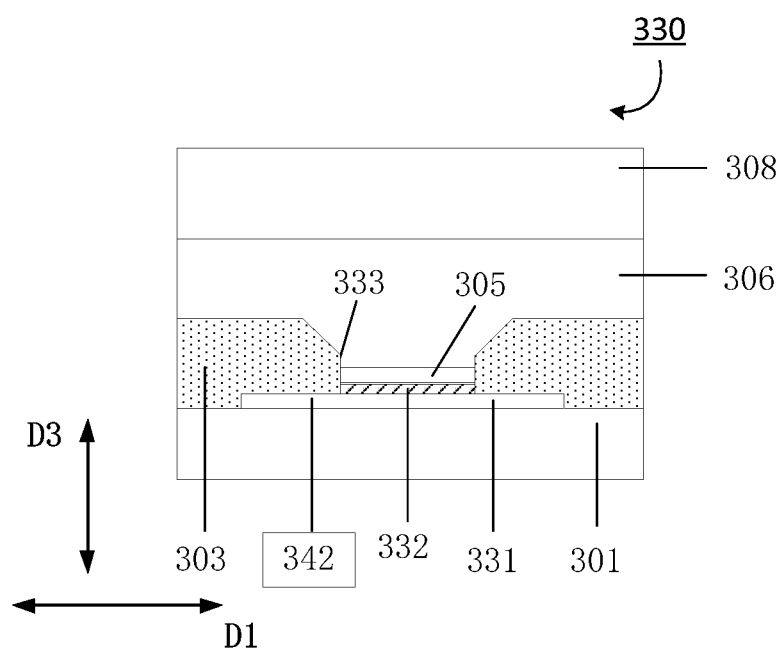
FIG. 7C is a partial cross-sectional schematic diagram of a third pixel unit of still another display substrate shown in FIG. 7A.

FIG. 7B is a partial cross-sectional schematic diagram of the first pixel unit 310 and the second pixel unit 320 of a further display substrate 300 shown in FIG. 7A; and FIG. 7C is a partial cross-sectional schematic diagram of the third pixel unit 330 of a further display substrate 300 shown in FIG. 7A. The partial cross-sectional schematic diagram of the first pixel unit 310 and the second pixel unit 320 shown in FIG. 7B is obtained by respectively sectioning along a line A-A' and a line B-B' shown in FIG. 7A, and the partial cross-sectional schematic diagram of the third pixel unit 330 shown in FIG. 7C is obtained by sectioning along a line C-C' shown in FIG. 7A.

As illustrated in FIG. 7B, the first pixel unit 310 includes a first electrode 311, a first light-emitting layer 312 and an opposed electrode 305 that are stacked; and the second pixel unit 320 includes a second electrode 321, a second light-emitting layer 322 and an opposed electrode 305 that are stacked. As illustrated in FIG. 7C, the third pixel unit 330 includes a third electrode 331, a third light-emitting layer 332 and an opposed electrode 305 that are stacked. For example, as illustrated in FIG. 7B and FIG. 7C, the first electrode 311, the second electrode 321 and the third electrode 331 are spaced apart and electrically insulated from each other.

For example, the first electrode 311, the second electrode 321 and the third electrode 331 are respectively configured as an anode of the first pixel unit 310, an anode of the second pixel unit 320, and an anode of the third pixel unit 330; the opposed electrode 305 of the first pixel unit 310, the opposed electrode 305 of the second pixel unit 320, and the opposed electrode 305 of the third pixel unit 330 are respectively configured as a cathode of the first pixel unit 310, a cathode of the second pixel unit 320, and a cathode of the third pixel unit 330. The first light-emitting layer 312, the second light-emitting layer 322 and the third light-emitting layer 332 are respectively configured to emit a first monochromatic light, a second monochromatic light and a third monochromatic light; a color of the first monochromatic light, a color of the second monochromatic light, and a color of the third monochromatic light are different from each other. For example, the example shown in FIG. 4A may be referred to for a specific arrangement mode of the first electrode 311, the second electrode 321, the third electrode 331, the opposed electrode 305, the first light-emitting layer 312, the second light-emitting layer 322 and the third light-emitting layer 332, and no details will be repeated here.

As illustrated in FIG. 7B and FIG. 7C, the display substrate 300 further comprises a pixel defining layer 303. The pixel defining layer 303 is provided on a side, which is away from the base substrate 301, of the first electrode 311, the second electrode 321 and the third electrode 331, and the pixel defining layer 303 is formed with a first pixel opening 313, a second pixel opening 323 and a third pixel opening 333.

For example, as illustrated in FIG. 7B and FIG. 7C, a size of the first pixel opening 313 is larger than a size of the second pixel opening 323, and the size of the second pixel opening 323 is larger than a size of the third pixel opening 333, so the area of the effective light-emitting region 351 of the first light-emitting layer is larger than the area of the effective light-emitting region 352 of the second light-emitting layer, and the area of the effective light-emitting region 352 of the second light-emitting layer is larger than the area of the effective light-emitting region 353 of the third light-emitting layer. In this case, a matching degree of maximum brightness of the first pixel unit 310 (e.g., a maximum value of an intensity of light that can be output by the pixel unit), maximum brightness of the second pixel unit 320, and maximum brightness of the third pixel unit 330 may be improved. For example, the light emitted by the first pixel unit 310, the light emitted by the second pixel unit 320, and the light emitted by the third pixel unit 330 may be mixed into white light.

As illustrated in FIG. 7B and FIG. 7C, the area of the first electrode 311, the area of the second electrode 321, and the area of the third electrode 331 are all equal to each other, so the light-reflecting area of the first electrode 311 that is exposed in the first pixel unit 310, the light-reflecting area of the second electrode 321 that is exposed in the second pixel unit 320, and the light-reflecting area of the third electrode 331 that is exposed in the third pixel unit 330 are equal to each other. In this case, a matching degree of an intensity of ambient light reflected by the first pixel unit 310, an intensity of ambient light reflected by the second pixel unit 320, and an intensity of ambient light reflected by the third pixel unit 330 is improved. Therefore, the display substrate 300 provided by the embodiment of the present disclosure may suppress a color shift defect of the display substrate 300, and improve quality of a display picture displayed by the display substrate 300.

For example, the ambient light reflected by the first pixel unit 310, the ambient light reflected by the second pixel unit 320, and the ambient light reflected by the third pixel unit 330 may be mixed to form white light; in this situation, the display substrate 300 provided by the embodiment of the present disclosure may further suppress the color shift defect of the display substrate 300, and improve the quality of the display picture displayed by the display substrate 300.

As illustrated in FIG. 7B and FIG. 7C, the display substrate 300 further comprises an encapsulation layer 306, a protective layer 308, a photosensitive device 341 and a driving device 342. The encapsulation layer 306 and the protective layer 308 are sequentially arranged on the opposed electrode 305.

As illustrated in FIG. 7B and FIG. 7C, the photosensitive device 341 is provided between the encapsulation layer 306 and the protective layer 308, and is configured to sense an intensity of light reflected by the first electrode 311 during a display cycle interval. For example, an orthogonal projection of the photosensitive device 341 on the base substrate 301 is spaced apart from orthogonal projections of the first light-emitting layer 312, the second light-emitting layer 322 and the third light-emitting layer 332 on the base substrate 301. For example, by providing a photosensitive element, intensity information of the ambient light reflected by the first electrode 311 may be obtained; in addition, since the light-reflecting area of the first electrode 311, the light-reflecting area of the second electrode 321, and the light-reflecting area of the third electrode 331 are equal to each other, intensity information of the ambient light reflected by the second electrode 321 and intensity information of the ambient light reflected by the third electrode 331 may be obtained based on the intensity information of the ambient light reflected by the first electrode 311.

As illustrated in FIG. 7B and FIG. 7C, the driving device 342 is connected with the first electrode 311, the second electrode 321 and the third electrode 331, and is configured to supply a corrected driving signal (a driving signal required to subtract the intensity of the light reflected by the electrode), based on grayscale information of respective image pixels in an image to be displayed by the display substrate 300 and the intensity of the light reflected by the first electrode 311 sensed by the photosensitive module, so that brightness of the respective pixel units of the display substrate 300 is more approximate to predetermined brightness, which, thus, may further improve a display effect.

The driving device 342 is, for example, a controller, which may be implemented as a driver chip, and, for example, may be integrated with a driver chip (e.g., a T-con chip) for controlling display. The photosensitive device 341, for example, may include an appropriate type of photosensitive device, for example, a photodiode or a phototransistor, etc., and may also be connected with a signal processing circuit to perform processes such as amplification and analog-to-digital conversion on the detected signal.

It should be noted that, the photosensitive device 341 is not limited to being provided in the first pixel unit 310; according to actual application needs, the photosensitive device 341 may also be provided in the second pixel unit 320 or the third pixel unit 330; or a photosensitive device 341 is respectively provided in the first pixel unit 310, the second pixel unit 320 and the third pixel unit 330.

With respect to the display substrate shown in FIG. 7A to FIG. 7C, by providing a small number of (e.g., one) photosensitive device(s) 341 and the driving device 342, not only the color shift defect may be suppressed, but also brightness of the respective pixel unit is made more approximate to the predetermined brightness without providing a color filter layer and a polarizer, which, thus, may improve contrast of a display image and a display effect of the display substrate while reducing a thickness of the display substrate.

For example, the display substrate shown in FIG. 6A may also be provided with a photosensitive device and a driving device, the examples illustrated in FIG. 7A to FIG. 7C may be referred to for a specific arrangement mode thereof, and no details will be repeated here.

As illustrated in FIG. 4B, FIG. 6B and FIG. 7B, an orthogonal projection of the first pixel opening on the base substrate is located within an orthogonal projection of the first electrode on the base substrate, and an orthogonal projection of the second pixel opening on the base substrate is located within an orthogonal projection of the second electrode on the base substrate; the orthogonal projection of the first light-emitting layer on the base substrate is located within the orthogonal projection of the first pixel opening on the base substrate, and the orthogonal projection of the second light-emitting layer on the base substrate is located within the orthogonal projection of the second pixel opening on the base substrate. As illustrated in FIG. 4B, FIG. 6B and FIG. 7B, an orthogonal projection of the first black matrix opening on the base substrate is located within the orthogonal projection of the first electrode on the base substrate, and an orthogonal projection of the second black matrix opening on the base substrate is located within the orthogonal projection of the second electrode on the base substrate.

Figure 8:
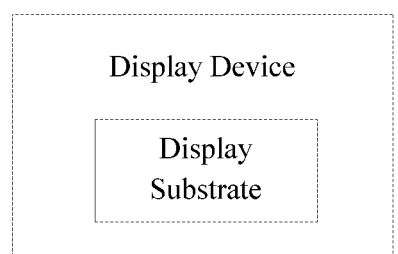
FIG. 8 is an exemplary block diagram of a display device provided by at least one embodiment of the present disclosure.

At least one embodiment of the present disclosure further provides a display device; and as illustrated in FIG. 8, the display device comprises the display substrate provided by any one embodiment of the present disclosure.

It should be noted that, with respect to other components of the display device (e.g., a thin film transistor control device, an image data encoding/decoding device, a row scan driver, a column scan driver and a clock circuit, etc.), applicable conventional components may be adopted, and these should all be understood by those ordinarily skilled in the art, which will not be repeated here, and should not be taken as limitation to the present disclosure. Because the display substrate according to the embodiment of the present disclosure is adopted, the display device may suppress a color shift defect.

At least one embodiment of the present disclosure further provides a fabrication method of a display substrate, and the fabrication method comprises: forming a first pixel unit and a second pixel unit arranged in parallel. The first pixel unit includes a first electrode and a first light-emitting layer that are stacked; the second pixel unit includes a second electrode and a second light-emitting layer that are stacked; an effective light-emitting area of the first light-emitting layer is unequal to an effective light-emitting area of the second light-emitting layer; and in a direction directly facing a display side of the display substrate, a light-reflecting area of the first electrode that is exposed in the first pixel unit is equal to a light-reflecting area of the second electrode that is exposed in the second pixel unit.

For example, the first electrode and the second electrode are spaced apart and insulated from each other; and an area of the first electrode is equal to an area of the second electrode.

For example, the fabrication method further comprises: providing a base substrate before the forming a first pixel unit and a second pixel unit arranged in parallel. The forming a first pixel unit and a second pixel unit arranged in parallel includes: forming a pixel defining layer on a side, which is away from the base substrate, of the first electrode and the second electrode; and forming a first pixel opening and a second pixel opening in the pixel defining layer. The first pixel unit includes the first pixel opening, and at least a portion of the first electrode and the first light-emitting layer overlaps with the first pixel opening in the direction; the second pixel unit includes the second pixel opening, and at least a portion of the second electrode and the second light-emitting layer overlaps with the second pixel opening in the direction.

For example, a size of the first pixel opening is unequal to a size of the second pixel opening; the effective light-emitting area of the first light-emitting layer is an area of the first light-emitting layer that is in the first pixel opening, and the effective light-emitting area of the second light-emitting layer is an area of the second light-emitting layer that is in the second pixel opening.

For example, the size of the first pixel opening is equal to the size of the second pixel opening; and the forming a first pixel unit and a second pixel unit further includes: forming a transparent insulating layer on a side, which is away from the base substrate, of the first electrode and the second electrode; forming a first insulating layer opening and a second insulating layer opening in the transparent insulating layer. The effective light-emitting area of the first light-emitting layer is the area of the first light-emitting layer that is in the first insulating layer opening, and the effective light-emitting area of the second light-emitting layer is the area of the second light-emitting layer that is in the second insulating layer opening.

Figure 9:
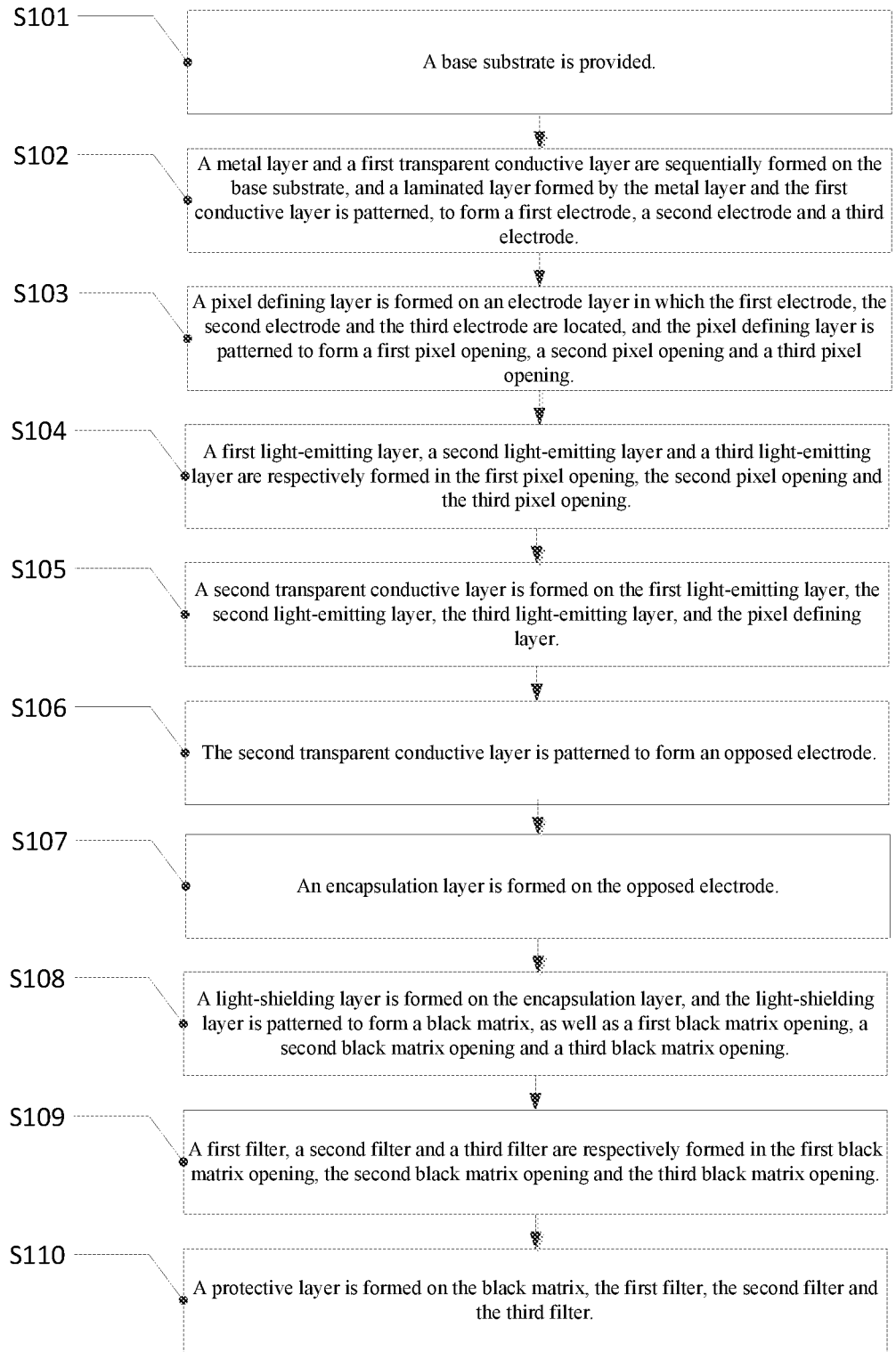
FIG. 9 is an exemplary flow chart of a fabrication method of a display substrate provided by at least one embodiment of the present disclosure.

For example, FIG. 9 is a flow chart of a fabrication method of a display substrate provided by at least one embodiment of the present disclosure. Taking the display substrate shown in FIG. 4A as an example, as illustrated in FIG. 9, the fabrication method may comprises steps below.

In step S101, a base substrate is provided.

In step S102, a metal layer and a first transparent conductive layer are sequentially formed on the base substrate, and a laminated layer formed by the metal layer and the first conductive layer is patterned, to form a first electrode, a second electrode and a third electrode. It should be noted that, in some examples, the first transparent conductive layer may not be formed.

In step S103, a pixel defining layer is formed on an electrode layer in which the first electrode, the second electrode and the third electrode are located, and the pixel defining layer is patterned to form a first pixel opening, a second pixel opening and a third pixel opening.

In step S104, a first light-emitting layer, a second light-emitting layer and a third light-emitting layer are respectively formed in the first pixel opening, the second pixel opening and the third pixel opening.

In step S105, a second transparent conductive layer is formed on the first light-emitting layer, the second light-emitting layer, the third light-emitting layer, and the pixel defining layer.

In step S106, the second transparent conductive layer is patterned to form an opposed electrode. In some examples, the fabrication method of the display substrate may not comprise step S106; in this situation, the second transparent conductive layer is configured as the opposed electrode.

In step S107, an encapsulation layer is formed on the opposed electrode.

In step S108, a light-shielding layer is formed on the encapsulation layer, and the light-shielding layer is patterned to form a black matrix, as well as a first black matrix opening, a second black matrix opening and a third black matrix opening.

In step S109, a first filter, a second filter and a third filter are respectively formed in the first black matrix opening, the second black matrix opening and the third black matrix opening.

In step S110, a protective layer is formed on the black matrix, the first filter, the second filter and the third filter.

For example, the fabrication method of the display substrate provided in FIG. 9 may be executed sequentially according to step S101 to step S110.

Figure 10:
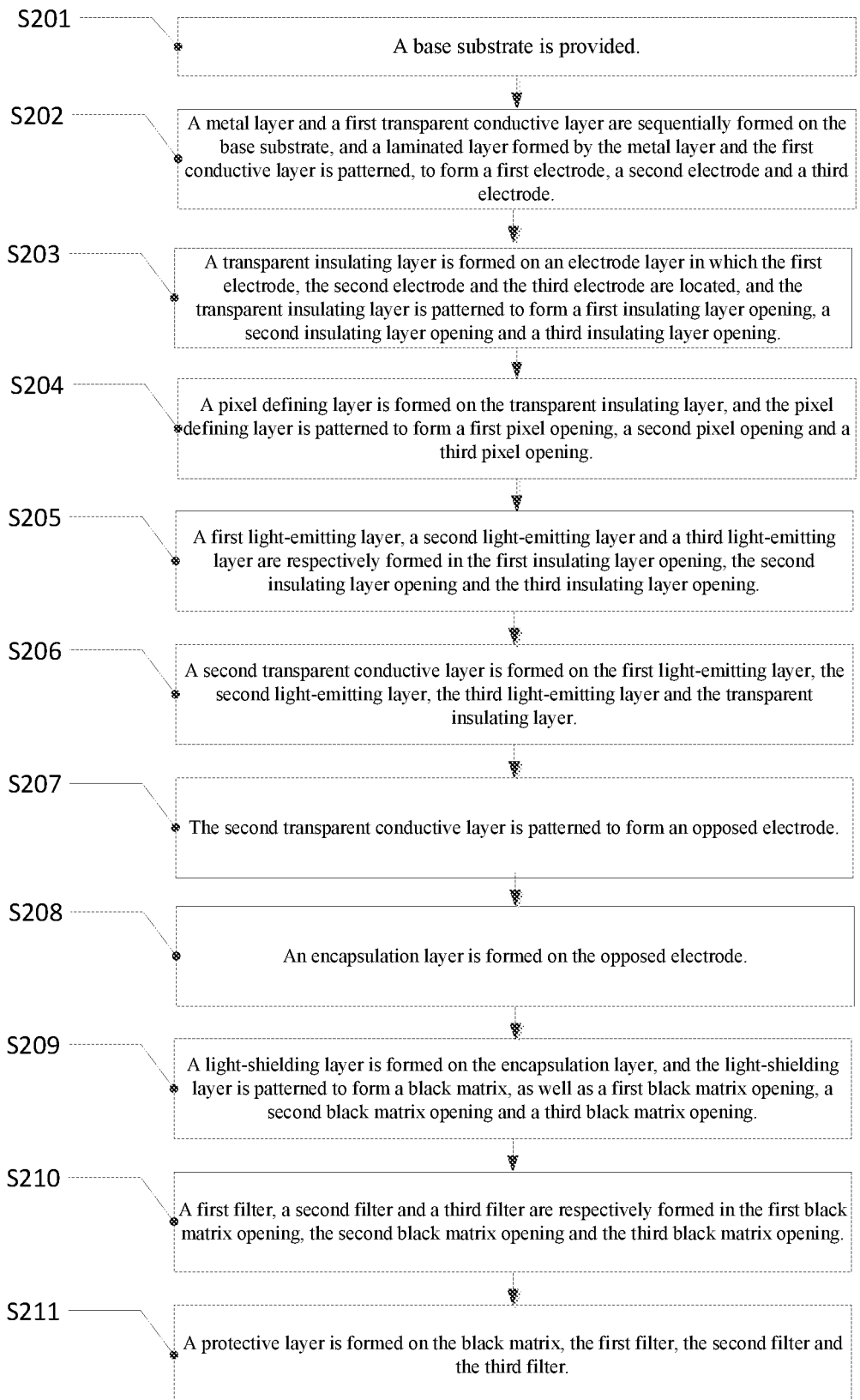
FIG. 10 is another exemplary flow chart of a fabrication method of a display substrate provided by at least one embodiment of the present disclosure.

For example, FIG. 10 is a flow chart of a fabrication method of a display substrate provided by at least one embodiment of the present disclosure. Taking the display substrate shown in FIG. 6A as an example, as illustrated in FIG. 10, the fabrication method may comprises step S201 to step S211 below.

In step S201, a base substrate is provided.

In step S202, a metal layer and a first transparent conductive layer are sequentially formed on the base substrate, and a laminated layer formed by the metal layer and the first conductive layer is patterned, to form a first electrode, a second electrode and a third electrode. It should be noted that, in some examples, the first transparent conductive layer may not be formed.

In step S203, a transparent insulating layer is formed on an electrode layer in which the first electrode, the second electrode and the third electrode are located, and the transparent insulating layer is patterned to form a first insulating layer opening, a second insulating layer opening and a third insulating layer opening.

In step S204, a pixel defining layer is formed on the transparent insulating layer, and the pixel defining layer is patterned to form a first pixel opening, a second pixel opening and a third pixel opening.

In step S205, a first light-emitting layer, a second light-emitting layer and a third light-emitting layer are respectively formed in the first insulating layer opening, the second insulating layer opening and the third insulating layer opening.

In step S206, a second transparent conductive layer is formed on the first light-emitting layer, the second light-emitting layer, the third light-emitting layer and the transparent insulating layer.

In step S207, the second transparent conductive layer is patterned to form an opposed electrode. In some examples, the fabrication method of the display substrate may not comprise step S207; in this situation, the second transparent conductive layer is configured as the opposed electrode.

In step S208, an encapsulation layer is formed on the opposed electrode.

In step S209, a light-shielding layer is formed on the encapsulation layer, and the light-shielding layer is patterned to form a black matrix, as well as a first black matrix opening, a second black matrix opening and a third black matrix opening.

In step S210, a first filter, a second filter and a third filter are respectively formed in the first black matrix opening, the second black matrix opening and the third black matrix opening.

In step S211, a protective layer is formed on the black matrix, the first filter, the second filter and the third filter.

For example, the fabrication method of the display substrate provided in FIG. 10 may be executed sequentially according to step S201 to step S211. For another example, execution orders of step S203 and step S204 may be exchanged with each other.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

What is claimed is:

1. A display substrate, comprising a first pixel unit and a second pixel unit, wherein the first pixel unit comprises a first electrode and a first light-emitting layer that are stacked;
   the second pixel unit comprises a second electrode and a second light-emitting layer that are stacked;
   an effective light-emitting area of the first light-emitting layer is unequal to an effective light-emitting area of the second light-emitting layer; and
   in a direction directly facing a display side of the display substrate, a light-reflecting area of the first electrode that is exposed in the first pixel unit is equal to a light-reflecting area of the second electrode that is exposed in the second pixel unit.

2. The display substrate according to claim 1, wherein the first electrode and the second electrode are spaced apart and insulated from each other; and an area of the first electrode is equal to an area of the second electrode.

3. The display substrate according to claim 1, further comprising a base substrate and a pixel defining layer,
   wherein the pixel defining layer is on a side, which is away from the base substrate, of both the first electrode and the second electrode; and the pixel defining layer is formed with a first pixel opening and a second pixel opening;
   the first pixel unit comprises the first pixel opening, and the second pixel unit comprises the second pixel opening;
   an orthogonal projection of the first pixel opening on the base substrate is within an orthogonal projection of the first electrode on the base substrate, and an orthogonal projection of the second pixel opening on the base substrate is within an orthogonal projection of the second electrode on the base substrate;
   an orthogonal projection of the first light-emitting layer on the base substrate is within the orthogonal projection of the first pixel opening on the base substrate, and an orthogonal projection of the second light-emitting layer on the base substrate is within the orthogonal projection of the second pixel opening on the base substrate.

4. The display substrate according to claim 3, wherein a size of the first pixel opening is unequal to a size of the second pixel opening; and
   the effective light-emitting area of the first light-emitting layer is an area, in the first pixel opening, of the first light-emitting layer, and the effective light-emitting area of the second light-emitting layer is an area, in the second pixel opening, of the second light-emitting layer.

5. The display substrate according to claim 4, wherein an overlapping area between the pixel defining layer and the first electrode is smaller than an overlapping area between the pixel defining layer and the second electrode.

6. The display substrate according to claim 3, wherein a size of the first pixel opening is equal to a size of the second pixel opening; and
the effective light-emitting area of the first light-emitting layer is smaller than the size of the first pixel opening, and the effective light-emitting area of the second light-emitting layer is smaller than the size of the second pixel opening.

7. The display substrate according to claim 6, further comprising a transparent insulating layer,
wherein the transparent insulating layer is on a side, which is away from the base substrate, of both the first electrode and the second electrode; and the transparent insulating layer is formed with a first insulating layer opening and a second insulating layer opening; and
the effective light-emitting area of the first light-emitting layer is an area, in the first insulating layer opening, of the first light-emitting layer, and the effective light-emitting area of the second light-emitting layer is an area, in the second insulating layer opening, of the second light-emitting layer.

8. The display substrate according to claim 7, wherein an overlapping area between the transparent insulating layer and the first electrode is smaller than an overlapping area between the transparent insulating layer and the second electrode.

9. The display substrate according to claim 7, wherein an electrode layer in which the first electrode and the second electrode are located, the transparent insulating layer and the pixel defining layer are sequentially arranged in a direction perpendicular to the base substrate.

10. The display substrate according to claim 7, wherein an electrode layer in which the first electrode and the second electrode are located, the pixel defining layer and the transparent insulating layer are sequentially arranged in a direction perpendicular to the base substrate.

11. The display substrate according to claim 1, further comprising a base substrate and a color filter layer,
wherein the color filter layer is on a side, which is away from the base substrate, of both the first light-emitting layer and the second light-emitting layer; and the color filter layer comprises a black matrix;
the black matrix is formed with a first black matrix opening and a second black matrix opening;
the first pixel unit comprises the first black matrix opening, and the second pixel unit comprises the second black matrix opening;
an orthogonal projection of the first black matrix opening on the base substrate is within the orthogonal projection of the first electrode on the base substrate, and an orthogonal projection of the second black matrix opening is within the orthogonal projection of the second electrode on the base substrate; and
the first black matrix opening exposes a light reflection region of the first electrode, and the second black matrix opening exposes a light reflection region of the second electrode.

12. The display substrate according to claim 11, wherein a size of the first black matrix opening is equal to a size of the second black matrix opening;
a size of the first electrode is larger than or equal to the size of the first black matrix opening, and a size of the second electrode is larger than or equal to the size of the second black matrix opening; and
a separation distance between the black matrix and the first electrode in the direction directly facing the display side of the display substrate is equal to a separation distance between the black matrix and the second electrode in the direction directly facing the display side of the display substrate.

13. The display substrate according to claim 11, wherein the color filter layer further comprises a first filter and a second filter;
the first filter is in the first black matrix opening, and the second filter is in the second black matrix opening;
the first light-emitting layer is configured to emit first monochromatic light, and the second light-emitting layer is configured to emit second monochromatic light; and
a color of the first filter is same as a color of the first monochromatic light, and a color of the second filter is same as a color of the second monochromatic light.

14. The display substrate according to claim 11, further comprising an opposed electrode layer, an encapsulation layer and a protective layer,
wherein the opposed electrode layer is on a side, which is away from the base substrate, of both the first light-emitting layer and the second light-emitting layer;
the encapsulation layer is between the opposed electrode layer and the color filter layer; and
the protective layer is on a side of the color filter layer that is away from the base substrate.

15. The display substrate according to claim 1, wherein the effective light-emitting area of the first light-emitting layer is larger than the effective light-emitting area of the second light-emitting layer.

16. The display substrate according to claim 15, further comprising a third pixel unit,
wherein the third pixel unit comprises a third electrode and a third light-emitting layer that are stacked;
the effective light-emitting area of the second light-emitting layer is larger than an effective light-emitting area of the third light-emitting layer; and
in the direction directly facing the display side of the display substrate, the light-reflecting area of the second electrode that is exposed in the second pixel unit is equal to a light-reflecting area of the third electrode that is exposed in the third pixel unit.

17. A display device, comprising the display substrate according to claim 1.

18. A fabrication method of a display substrate, comprising: forming a first pixel unit and a second pixel unit,
wherein the first pixel unit comprises a first electrode and a first light-emitting layer that are stacked;
the second pixel unit comprises a second electrode and a second light-emitting layer that are stacked;
an effective light-emitting area of the first light-emitting layer is unequal to an effective light-emitting area of the second light-emitting layer; and
in a direction directly facing a display side of the display substrate, a light-reflecting area of the first electrode that is exposed in the first pixel unit is equal to a light-reflecting area of the second electrode that is exposed in the second pixel unit.

19. The fabrication method according to claim 18, wherein the first electrode and the second electrode are spaced apart and insulated from each other;
an area of the first electrode is equal to an area of the second electrode.

20. The fabrication method according to claim 18, further comprising: providing a base substrate before the forming the first pixel unit and the second pixel unit,
- wherein the forming the first pixel unit and the second pixel unit comprises:
  - forming the pixel defining layer on a side, which is away from the base substrate, of the first electrode and the second electrode; and
  - forming a first pixel opening and a second pixel opening in the pixel defining layer,
  - wherein the first pixel unit comprises the first pixel opening, and the second pixel unit comprises the second pixel opening;
  - an orthogonal projection of the first pixel opening on the base substrate is within an orthogonal projection of the first electrode on the base substrate, and an orthogonal projection of the second pixel opening on the base substrate is within an orthogonal projection of the second electrode on the base substrate; and
  - an orthogonal projection of the first light-emitting layer on the base substrate is within the orthogonal projection of the first pixel opening on the base substrate, and an orthogonal projection of the second light-emitting layer on the base substrate is within the orthogonal projection of the second pixel opening on the base substrate.

* * * * *